United States Patent
Nishimoto et al.

(10) Patent No.: US 9,326,368 B2
(45) Date of Patent: *Apr. 26, 2016

(54) ELECTRONIC CONTROL UNIT AND ELECTRIC POWER STEERING APPARATUS HAVING THE SAME

(71) Applicant: DENSO CORPORATION, Kariya, Aichi-pref. (JP)

(72) Inventors: Ryo Nishimoto, Kariya (JP); Shinsuke Oota, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/582,898

(22) Filed: Dec. 24, 2014

(65) Prior Publication Data

US 2015/0189734 A1 Jul. 2, 2015

(30) Foreign Application Priority Data

Dec. 26, 2013 (JP) .................................. 2013-269365

(51) Int. Cl.
*G06F 17/00* (2006.01)
*H05K 1/02* (2006.01)
(Continued)

(52) U.S. Cl.
CPC ............ *H05K 1/0209* (2013.01); *H05K 3/3415* (2013.01); *H05K 7/1432* (2013.01); *H05K 2201/066* (2013.01); *H05K 2201/10189* (2013.01)

(58) Field of Classification Search
CPC ........... H01L 2924/00014; H01L 2224/48091; H01L 2924/00; H01L 2224/32225; H01L 2224/48227; H05K 7/20509; H05K 1/0203; H05K 1/0298; H05K 1/116; B62D 5/0406

USPC .................... 701/1, 41; 29/846, 852; 347/58; 174/254; 257/38, 48, 738
See application file for complete search history.

(56) References Cited

U.S. PATENT DOCUMENTS 5,268,813 A * 12/1993 Chapman ............ H01L 23/5387
257/E23.177
6,028,358 A * 2/2000 Suzuki .................... H01L 22/32
257/48

(Continued)

FOREIGN PATENT DOCUMENTS

| JP | 2000-252656 | 9/2000 |
| JP | 2002-299873 | 10/2002 |
| JP | 2009-026780 | 2/2009 |

OTHER PUBLICATIONS

Nishimura, U.S. Appl. No. 14/582,465, filed Dec. 24, 2014.
(Continued)

*Primary Examiner* — McDieunel Marc
(74) *Attorney, Agent, or Firm* — Nixon & Vanderhye PC

(57) ABSTRACT

An electronic control unit includes a board, a heat-generating device, a connector, and a heatsink. The board has an insulating layer and a wiring pattern partially exposed outside the insulating layer. The heat-generating device is mounted on the board and electrically connected to the wiring pattern. The connector is located adjacent to the heat-generating device and has a connection terminal connected to the wiring pattern. The heatsink is located opposite to the board across the heat-generating device and in contact with the heat-generating device to dissipate heat of the heat-generating device. The wiring pattern has a land pattern including a mount portion and a connection portion. The heat-generating device is mounted on the mount portion. The connection terminal of the connector is connected to the connection portion.

12 Claims, 22 Drawing Sheets

(51) Int. Cl.
*H05K 7/14* (2006.01)
*H05K 3/34* (2006.01)

(56) References Cited

U.S. PATENT DOCUMENTS

| | | |
|---|---|---|
| 2011/0013370 A1 | 1/2011 | Oota |
| 2011/0266579 A1* | 11/2011 | Nagai .................... H01L 27/156 257/98 |
| 2014/0252612 A1* | 9/2014 | Nakagawa .............. H01L 23/12 257/738 |
| 2015/0183456 A1 | 7/2015 | Nishimura |
| 2015/0189733 A1 | 7/2015 | Shibata |
| 2015/0189794 A1 | 7/2015 | Tashima et al. |

OTHER PUBLICATIONS

Tashima et al., U.S. Appl. No. 14/582,877, filed Dec. 24, 2014.
Shibata, U.S. Appl. No. 14/582,529, filed Dec. 24, 2014.
Office Action (2 pages) dated Jan. 26, 2016, issued in corresponding Japanese Application No. 2013-269365 and English translation (3 pages).

* cited by examiner

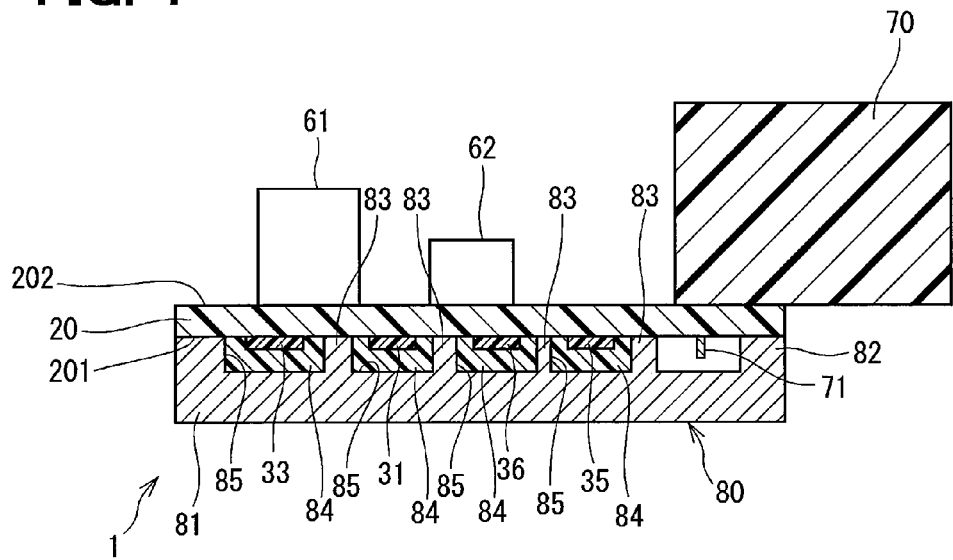

ELECTRONIC CONTROL UNIT AND ELECTRIC POWER STEERING APPARATUS HAVING THE SAME

CROSS REFERENCE TO RELATED APPLICATION

This application is based on and claims priority to Japanese Patent Application No. 2013-269365 filed on Dec. 26, 2013, the contents of which are incorporated herein by reference.

FIELD

The present disclosure relates to an electronic control unit and an electric power steering apparatus having the electronic control unit.

BACKGROUND

An electronic control unit in which heat generated from a semiconductor module is dissipated to another object such as a heatsink is known. For example, in JP-A-2011-23459 corresponding to U.S. 2011/0013370A1, an electrically-insulating and heat-dissipating sheet or a heat-dissipating gel is placed between a semiconductor module and a heatsink, and heat generated in the semiconductor module is dissipated to the heatsink from the backside.

However, JP-A-2011-23459 does not consider dissipating the heat generated in the semiconductor module to the same side as the board.

SUMMARY

In view of the above, it is an object of the present disclosure to provide an electronic control unit in which heat generated in a heat-generating device is dissipated with high efficiency and to provide an electric power steering apparatus having the electronic control unit.

According to an aspect of the present disclosure, an electronic control unit includes a board, a heat-generating device, a connector, and a heatsink. The board has an insulating layer and a wiring pattern partially exposed outside the insulating layer. The heat-generating device is mounted on the board and electrically connected to the wiring pattern. The connector is located adjacent to the heat-generating device and has a connection terminal connected to the wiring pattern. The heatsink is located opposite to the board across the heat-generating device and in contact with the heat-generating device to dissipate heat of the heat-generating device. The wiring pattern has a land pattern including a mount portion and a connection portion. The heat-generating device is mounted on the mount portion. The connection terminal of the connector is connected to the connection portion.

BRIEF DESCRIPTION OF THE DRAWINGS

The above and other objects, features and advantages of the present disclosure will become more apparent from the following detailed description made with reference to the accompanying drawings. In the drawings:

FIG. 4 is a diagram illustrating a cross-sectional view taken along line IV-IV in FIG. 3;

FIG. 5 is a diagram illustrating a cross-sectional view of a heat-generating device located adjacent to a connector according to the first embodiment of the present disclosure;

DETAILED DESCRIPTION

Embodiments of the present disclosure are described below with reference to the drawings in which like characters of reference indicate the same or equivalent parts.

First Embodiment

Figure 1:
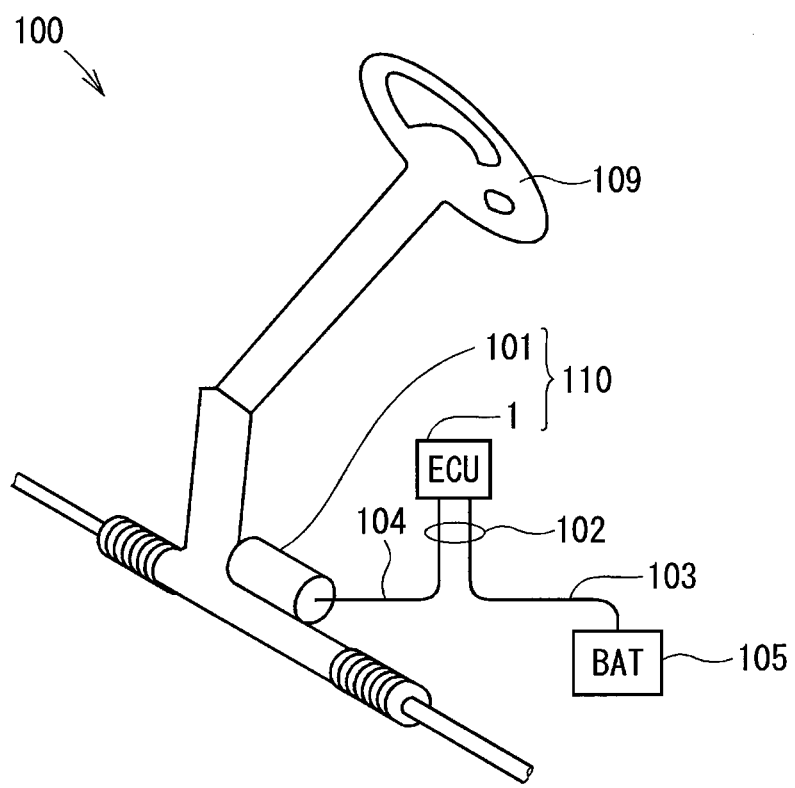
FIG. 1 is a diagram illustrating a structure of an electric power steering apparatus according to a first embodiment of the present disclosure.

As shown in FIG. 1, an electronic control unit 1 according to a first embodiment of the present disclosure is used in an electric power steering apparatus 100 of a vehicle. The electronic control unit 1 drives and controls a motor 101 as a rotating electrical machine based on a steering torque signal and a vehicle speed signal so that the motor 101 can produce assisting-torque to help a driver to steer the vehicle. An electronic power steering apparatus 110 includes the electronic control unit 1 and the motor 101.

Figure 3:
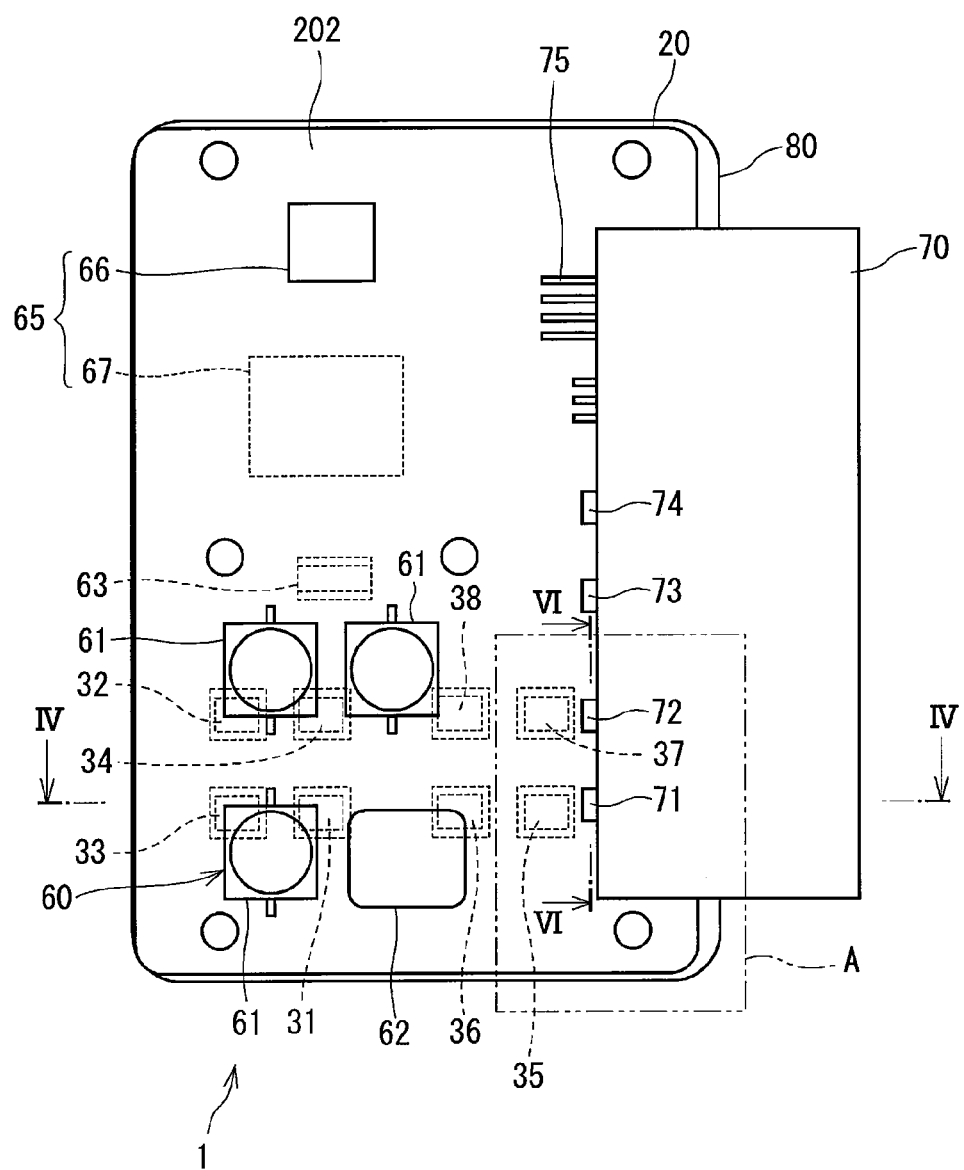
FIG. 3 is a diagram illustrating a plan view of the electric control unit according to the first embodiment of the present disclosure.

As shown in FIGS. 3 and 4, the electronic control unit 1 includes a board 20, heat-generating devices 31-38, a connector 70, and a heatsink 80.

The heat-generating devices 31-38 are field-effect transistors such as metal-oxide-semiconductor field-effect transistors (MOSFETs). According to the first embodiment, the heat-generating devices 31-34 are driving devices for driving purposes. The heat-generating devices 35 and 36 are used as power supply relays, and the heat-generating devices 37 and 38 are used as motor relays. The heat-generating devices 31-34 are hereinafter sometimes referred to as the "driving MOSFETs 31-34", the heat-generating devices 35 and 36 are hereinafter sometimes referred to as the "PS-relay MOSFETs 35 and 36", and the heat-generating devices 37 and 38 are hereinafter sometimes referred to as the "motor-relay MOSFETs 37 and 38". Also, the heat-generating devices 31-38 are hereinafter sometimes referred to simply as the "MOSFETs 31-38".

Figure 2:
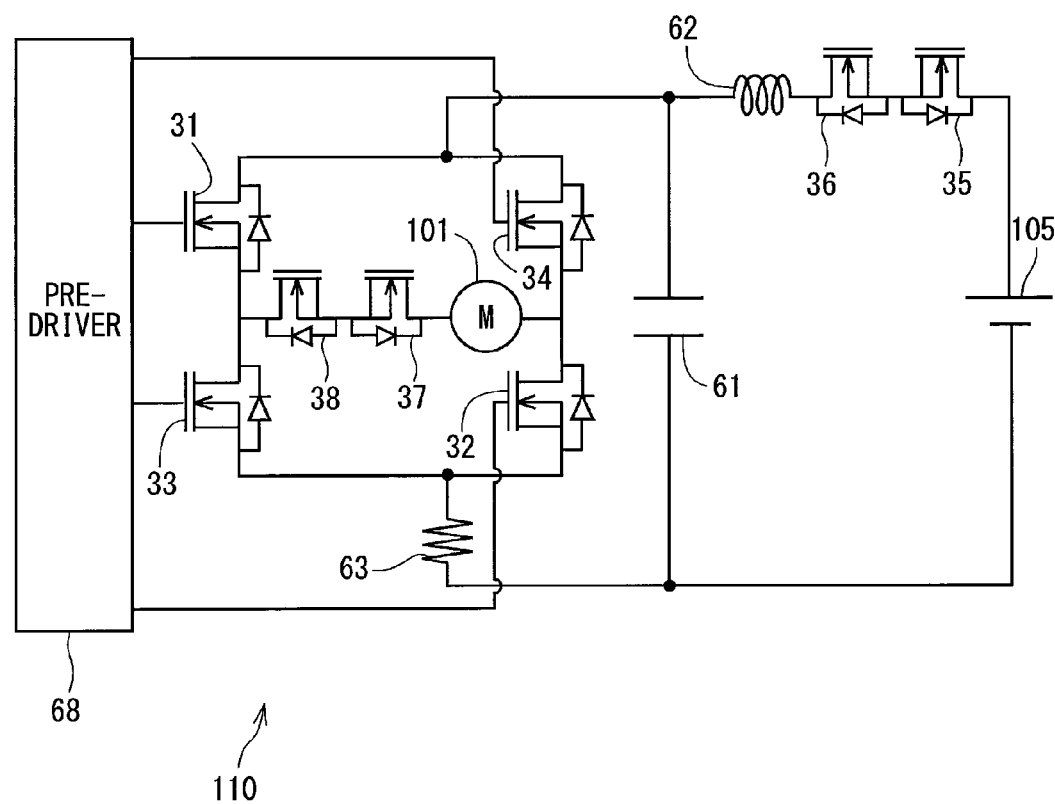
FIG. 2 is a diagram illustrating a circuit structure of an electric control unit according to the first embodiment of the present disclosure.

Firstly, a circuit structure of the electronic control unit 1 is described with reference to FIG. 2. It is noted that the components shown in FIG. 2 including the MOSFETs 31-38 and excluding the motor 101 and a battery 105 form the electronic control unit 1. The driving MOSFETs 31-34 are connected to form an H-bridge circuit and supply electric current to the motor 101 by switching electric current supplied from the battery 105.

When a steering wheel 109 (see, FIG. 1) is turned to the right, two driving MOSFETs 31 and 32, which are symmetrically arranged with respect to the motor 101, are turned ON so that the motor 101 can be driven. At this time, the other two driving MOSFETs 33 and 34 are turned OFF.

When the steering wheel 109 is turned to the left, two driving MOSFETs 33 and 34, which are symmetrically arranged with respect to the motor 101, are turned ON so that the motor 101 can be driven. At this time, the other two driving MOSFETs 31 and 32 are turned OFF.

The PS-relay MOSFETs 35 and 36 are connected between the battery 105 and a coil 62 in such a manner that directions of parasitic diodes of the PS-relay MOSFETs 35 and 36 are opposite to each other.

The motor-relay MOSFETs 37 and 38 are connected between the motor 101 and a node between the driving MOSFETs 31 and 33 in such a manner that directions of parasitic diodes of the motor-relay MOSFETs 37 and 38 are opposite to each other.

For example, the capacitor 61 can be an aluminum electrolytic capacitor. The capacitor 61 is connected in parallel with the battery 105 and stores charge. The capacitor 61 supplements power supply to the driving MOSFETs 31-34 and reduces noise components such as surge voltage.

The coil 62 is connected between the battery 105 and the H-bridge circuit, which is constructed with the driving MOSFETs 31-34, and reduces noise. A shunt resistor 63 is used to detect electric current supplied to the motor 101.

As shown in FIGS. 3 and 4, the board 20 is a printed circuit board such as a FR4 (Flame Retardant Type 4) made of a glass woven fabric with epoxy resin. The MOSFETs 31-38, a power section 60, and a control section 65 are mounted on the board 20. The power section 60 is supplied with a relatively large current. On the other hand, the control section 65 is supplied with a relatively small current and performs drive control. The power section 60 includes the capacitor 61, the coil 62, and the shunt resistor 63. The control section 65 includes a microcomputer 66 and a custom integrated circuit (IC) 67. The custom IC 67 has a pre-driver 68 (see, FIG. 2).

A connector 70 is connected to the board 20. According to the first embodiment, the MOSFETs 31-38 are mounted on a first surface 201 of the board 20, and the connector 70 is mounted on a second surface 202 of the board 20. FIG. 4 is a cross sectional view taken along line IV-IV in FIG. 3. For the sake of simplicity, the MOSFETs 31-38 are illustrated in a simplified way in FIG. 4.

Figure 6:
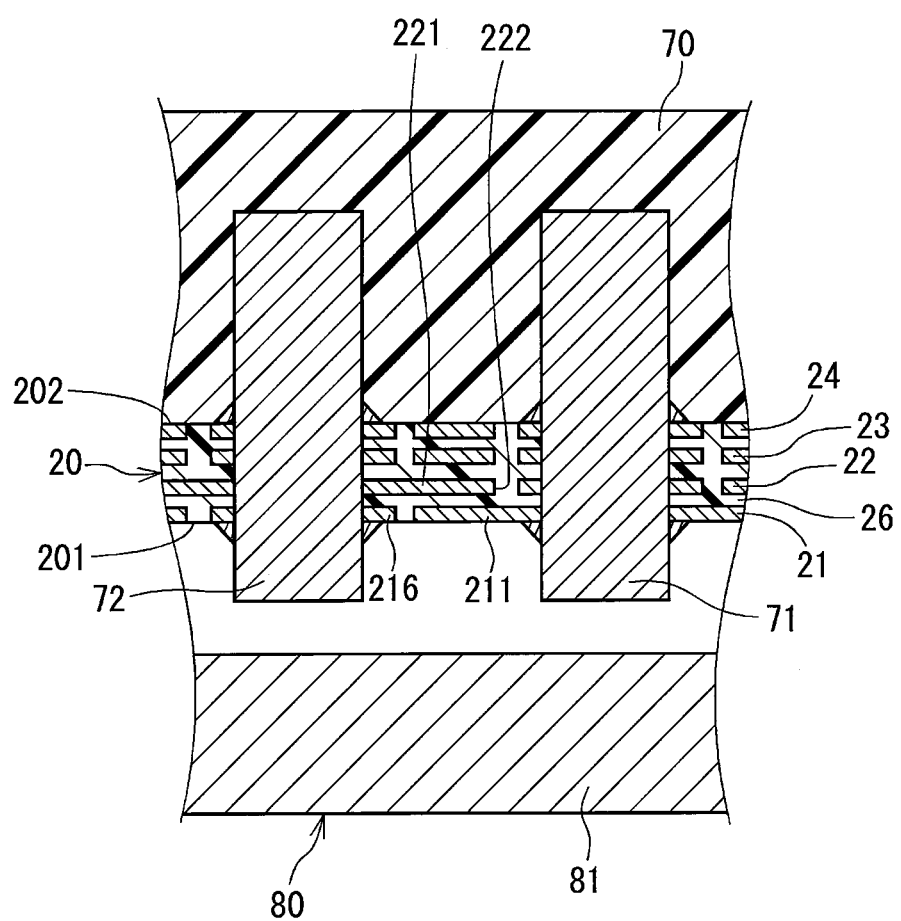
FIG. 6 is a diagram illustrating a cross-sectional view taken along line VI-VI in FIG. 3.

As shown in FIG. 5 and FIG. 6, the board 20 includes four layer wiring patterns arranged from the first surface 201 side in the following order: a first layer wiring pattern 21, a second layer wiring pattern 22, a third layer wiring pattern 23, and a fourth layer wiring pattern 24. An electrically insulating layer 26 is interposed between the first layer wiring pattern 21 and the second layer wiring pattern 22, between the second layer wiring pattern 22 and the third layer wiring pattern 23, and between the third layer wiring pattern 23 and the fourth layer wiring pattern 24. Thus, the first layer wiring pattern 21, the second layer wiring pattern 22, the third layer wiring pattern 23, and the fourth layer wiring pattern 24 are separated from one another.

The first layer wiring pattern 21 is at least partially exposed to the first surface 201 side. A green mask 27 is formed at a position where the first layer wiring pattern 21 is in contact with the heatsink 80. Thus, electrical insulation between the first layer wiring pattern 21 and the heatsink 80 can be ensured.

The second layer wiring pattern 22 and the third layer wiring pattern 23 are buried in the insulating layer 26. The fourth layer wiring pattern 24 is at least partially exposed to the second surface 202 side. Although not shown in the drawings, a green mask is formed on the second surface 202 side of the board 20.

As shown in FIGS. 3 and 4, the MOSFETs 31-38 are mounted on the first surface 201 side of the board 20.

The PS-relay MOSFETs 35 and 36 and the motor-relay MOSFETs 37 and 38 are located closer to the connecter 70 than the driving MOSFETs 31-34. The PS-relay MOSFETs 35 and 36 are located outside the motor-relay MOSFETs 37 and 38. The PS-relay MOSFET 35 is located closer to the connector 70 than the PS-relay MOSFET 36. The motor-relay MOSFET 37 is located closer to the connector 70 than the motor-relay MOSFET 38. The PS-relay MOSFET 35 and the motor-relay MOSFET 37 correspond to a heat-generating device located adjacent to a connector recited in claims.

The power section 60 includes the capacitor 61, the coil 62, and the shunt resistor 63. The capacitor 61 and the coil 62 are mounted on the second surface 202 of the board 20, and the shunt resistor 63 is mounted on the first surface 201 of the board 20.

The control section 65 includes the microcomputer 66 and the custom IC 67. The microcomputer 66 is mounted on the second surface 202 of the board 20, and the custom IC 67 is mounted on the first surface 201 of the board 20. The microcomputer 66 generates a driving signal based on the steering torque signal and the vehicle speed signal which are received by the microcomputer 66 via the connector 70. The driving signal is outputted from the pre-driver 68 of the custom IC 67, and the MOSFETs 31-38 are turned ON and OFF in accordance with the driving signal.

The connector 70 is mounted on the second surface 202 side of the board 20 and arranged along one side of the board 20. The connector 70 has a power supply voltage (PIG) terminal 71, a ground (GND) terminal 72, motor terminals 73 and 74, and a control terminal 75.

Figure 7:
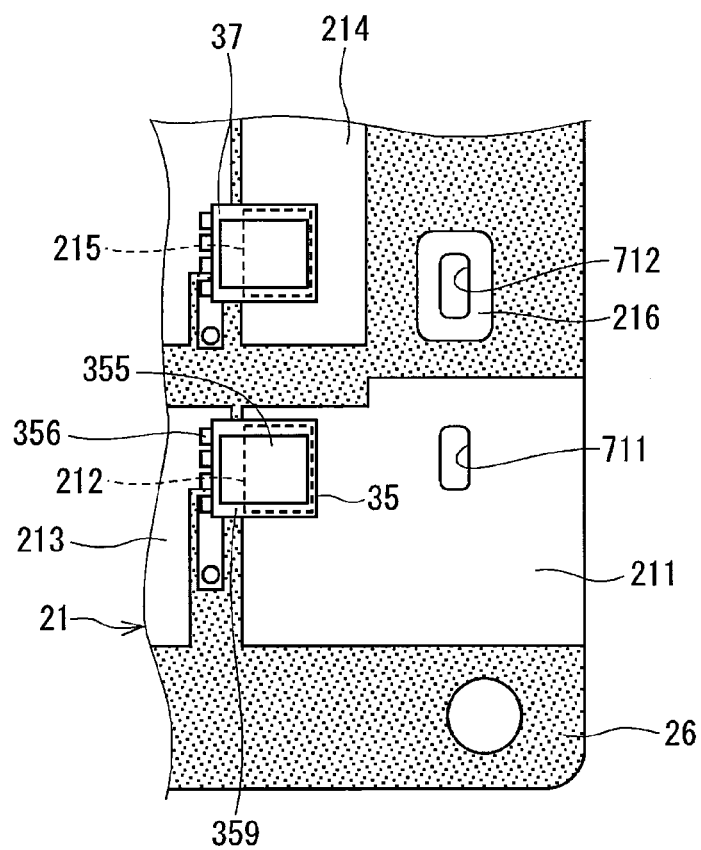
FIG. 7 is a diagram illustrating a plan view of a first layer wiring pattern according to the first embodiment of the present disclosure.
Figure 8:
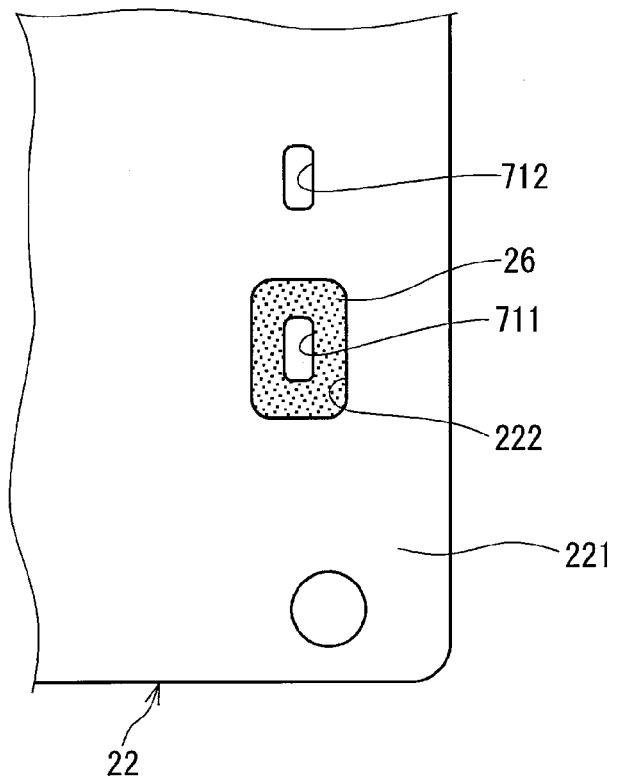
FIG. 8 is a diagram illustrating a plan view of a second layer wiring pattern according to the first embodiment of the present disclosure.

As shown in FIGS. 5, 7, and 8, the PIG terminal 71 is inserted through a PIG terminal hole 711 of the board 20 and connected to the board 20 by solder or the like. The GND terminal 72 is inserted through a GND terminal hole 712 of the board 20 and connected to the board 20 by solder or the like.

Although not shown in the drawings, the motor terminals 73 and 74 are inserted through motor terminal holes of the board 20 and connected to the board 20 by solder or the like. Likewise, the control terminal 75 is inserted through a control terminal hole of the board 20 and connected to the board 20 by solder or the like. The control terminal 75 is electrically connected to the microcomputer 66 and the custom IC 67.

A harness 102 (see, FIG. 1) having conductive wires 103 and 104 is connected to the connector 70. The conductive wire 103 of the harness 102 electrically connects the PIG terminal 71 to a positive terminal of the battery 105. The conductive wire 104 of the harness 102 electrically connects the motor terminals 73 and 74 to winding terminals of the motor 101.

As shown in FIGS. 3 and 4, the PIG terminal 71 is electrically connected to the PS-relay MOSFET 35, which is located closer to the connector 70 than the PS-relay MOSFET 36. The motor terminal 73 is located closer to the GND terminal 72 than the motor terminal 74 and electrically connected to the motor-relay MOSFET 37, which is located closer to the connector 70 than the motor-relay MOSFET 38.

The PIG terminal 71, the GND terminal 72, and the motor terminals 73 and 74 are wider than the control terminal 75. Specifically, the PIG terminal 71, the GND terminal 72, and the motor terminals 73 and 74 are sufficiently greater in their width direction than in their thickness direction.

As shown in FIGS. 4 and 5, the heatsink 80 is mounted on the first surface 201 side of the board 20. The heatsink 80 is made of metal with high heat conductivity such as aluminum. The heatsink 80 has a base portion 81, a frame portion 82, and pillar portions 83.

The base portion 81 is substantially parallel to the board 20. The frame portion 82 extends along an outer edge of the base portion 81 and projects toward the board 20. One end surface of the frame portion 82 is joined to the outer edge of base portion 81. The other end surface of the frame portion 82 is in contact with the first surface 201 of the board 20. Although not shown in the drawings, the frame portion 82 has a board mounting part used to fix the frame portion 82 to the board 20 by a screw or the like.

The pillar portions 83 project from the base portion 81 toward the board 20. For example, the pillar portions 83 are arranged in a grid. Tips of the pillar portions 83 are in contact with the first surface 201 of the board 20. A space defined by the base portion 81 and the frame portion 82 is sectioned by the pillar portions 83 into rooms 85. The MOSFETs 31-38 are placed in the rooms 85. For example, the MOSFETs 31-38 can be separately placed in different rooms 85. The rooms 85 where the MOSFETs 31-38 are placed are filled with a heat-dissipating gel 84. Thus, the MOSFETs 31-38 and the heatsink 80 are mechanically connected together through the heat-dissipating gel 84.

Next, a relationship between the PIG terminal 71, the PS-relay MOSFET 35, which is electrically connected to the PIG terminal 71, and the board 20 is described with reference to FIGS. 5 and 6.

As shown in FIG. 5, the PS-relay MOSFET 35 has a chip 351, a drain terminal 352, a source terminal 354 as a terminal portion, and a molding resin 359.

The chip 351, the drain terminal 352, and the source terminal 354 are encapsulated in the molding resin 359. The chip 351 is located between the drain terminal 352 and the source terminal 354. The drain terminal 352 is shaped in the form of a plate and exposed to a surface of the molding resin 359 on the board 20 side. The drain terminal 352 is connected to a mount portion 212 of a land pattern 211 of the board 20 by a solder 301. It is noted that the land pattern 211 is included in the first layer wiring pattern 21 of the board 20.

The source terminal 354 has a chip contact portion 355 and a lead portion 356. The source terminal 354 is made of copper and shaped in the form of a clip.

The chip contact portion 355 is shaped in the form of a plate and has a first surface in contact with a first surface of the chip 351 whose second surface is in contact with the drain terminal 352. Thus, the chip 351 is connected to the drain terminal 352 on one surface and connected to the chip contact portion 355 of the source terminal 354 on the other surface. Further, a second surface of the chip contact portion 355 is exposed outside the molding resin 359.

An end of the lead portion 356 is exposed to the surface of the molding resin 359 on the board 20 side. The end of the lead portion 356 is connected to a land pattern 213 of the board 20 by a solder 302. It is noted that the land pattern 213 is included in the first layer wiring pattern 21 of the board 20. Although not shown in FIG. 5, the MOSFET 36 is mounted on the land pattern 213 so that a drain terminal of the MOSFET 36 can be electrically connected to the land pattern 213. Thus, the source terminal of the PS-relay MOSFET 35 is connected to the drain terminal of the PS-relay MOSFET 36.

The land pattern 211 and the land pattern 213 are separated from each other by the insulating layer 26. The land pattern 211 has the PIG terminal hole 711. The PIG terminal 71 is inserted through the PIG terminal hole 711 and electrically connected to the land pattern 211 by a solder or the like. Thus, the PIG terminal 71 and the drain terminal 352 of the PS-relay MOSFET 35 are connected.

FIG. 7 shows the first layer wiring pattern 21 in an area A in FIG. 3. FIG. 8 shows the second layer wiring pattern 22 in the area A in FIG. 3. In FIGS. 7 and 8, the insulating layer 26 is hatched with dots for easy of understanding.

As shown in FIG. 7, the land pattern 211 is formed so that an impedance of the land pattern 211 can be as small as possible. Specifically, the land pattern 211 is formed so that the land pattern 211 can have at least the PIG terminal hole 711 and the mount portion 212 to which the drain terminal 352 of the PS-relay MOSFET 35 is connected.

The first layer wiring pattern 21 includes a land pattern 216 in addition to the land patterns 211 and 213. The GND terminal 72 is connected to the land pattern 216. The land pattern 216 is electrically isolated from other land patterns including the land patterns 211 and 213.

More specifically, the land pattern 211 spreads flatly over the area defined by outer edges of the mount portion 212 and the PIG terminal hole 711. The land pattern 211 may have a small hole, slit, or the like to prevent an electrical short-circuit. However, the land pattern 211 is not such a narrow land pattern to have the minimum width required to connect the mount portion 212 and the PIG terminal hole 711.

As shown in FIG. 8, the second layer wiring pattern 22 has a ground pattern 221 and a separation portion 222. The ground pattern 221 is a so-called solid ground pattern and spreads flatly almost all over the second layer wiring pattern 22. The separation portion 222 prevents terminals including the PIG terminal 71, which must be electrically isolated from the ground pattern 221, from being short-circuited. The ground pattern 221 of the second layer wiring pattern 22 overlaps the land pattern 211 of the first layer wiring pattern 21 in the thickness direction of the board 20. Further, the ground pattern 221 is equal to or greater in size than the land pattern 211. The GND terminal 72 is inserted through the GND terminal hole 712 and electrically connected to the second layer wiring pattern 22.

Next, a heat-dissipation path through which heat generated in the PS-relay MOSFET 35 at the time of switching is dissipated is described below.

A back surface of the PS-relay MOSFET 35 is in contact with the heat-dissipating gel 84 so that the PS-relay MOSFET 35 can be mechanically connected to the heatsink 80 through the heat-dissipating gel 84. Thus, the heat generated in the PS-relay MOSFET 35 at the time of switching is dissipated to the heatsink 80 from the back surface of the PS-relay MOSFET 35. In addition, since the PS-relay MOSFET 35 is placed in the room 85 and covered with the heat-dissipating gel 84, the heat generated in the PS-relay MOSFET 35 at the time of switching is dissipated to the pillar portions 83 of the heatsink 80 from side surfaces of the PS-relay MOSFET 35.

The land pattern 211, which is connected to the drain terminal 352 of the PS-relay MOSFET 35, spreads flatly and has the mount portion 212 and the PIG terminal hole 711 through which the PIG terminal 71 is inserted. The land pattern 211 is connected to the PIG terminal 71. Thus, heat generated in the PS-relay MOSFET 35 when the PS-relay MOSFET 35 is energized is dissipated from the drain terminal 352 to the connector 70 side through the land pattern 211 and the PIG terminal 71.

Further, the ground pattern 221 of the second layer wiring pattern 22 is equal to or greater in size than the land pattern 211 in the thickness direction of the board 20 and connected to the GND terminal 72. Thus, the heat generated in the PS-relay MOSFET 35 is dissipated from the land pattern 211 connected the drain terminal 352 to the connector 70 side through the insulating layer 26, the ground pattern 221, and the GND terminal 72. That is, according to the first embodiment, the heat generated in the PS-relay MOSFET 35 can be dissipated to the connector 70 side through the GND terminal 72 which is not directly connected to the PS-relay MOSFET 35.

In such an approach, the heat generated in the PS-relay MOSFET 35 dissipated not only to the heatsink 80 from the back surface of the PS-relay MOSFET 35 but also to the connector 70 from the board 20 through the PIG terminal 71 and the GND terminal 72.

Like the heat generated in the PS-relay MOSFET 35, heat generated in the motor-relay MOSFET 37 is dissipated not only to the heatsink 80 from a back surface of the motor-relay MOSFET 37 but also to the connector 70 from the board 20 through the motor terminals 73 and 74.

Specifically, as shown in FIG. 7, the first layer wiring pattern 21 further includes a land pattern 214 which spreads flatly. The land pattern 214 has a mount portion 215 and a motor terminal hole (not shown). The motor-relay MOSFET 37 is mounted on the mount portion 215. The motor terminal 73 is inserted through the motor terminal hole and connected to the land pattern 214. The ground pattern 221 of the second layer wiring pattern 22 is equal to or greater in size than the land pattern 214 and overlaps the land pattern 214 in the thickness direction of the board 20.

Thus, the heat generated in the motor-relay MOSFET 37 is dissipated not only to the heatsink 80 from the back surface of the motor-relay MOSFET 37 but also to the connector 70 through the land pattern 214 and the motor terminal 73. Further, the heat generated in the motor-relay MOSFET 37 is dissipated from the land pattern 214 to the connector 70 side through the insulating layer 26, the ground pattern 221, and the GND terminal 72. That is, according to the first embodiment, like the heat generated in the PS-relay MOSFET 35, the heat generated in the motor-relay MOSFET 37 can be dissipated to the connector 70 side through the GND terminal 72 which is not directly connected to the motor-relay MOSFET 37.

The first embodiment is summarized below. The electronic control unit 1 includes the board 20, the MOSFETs 31-38, the connector 70, and the heatsink 80.

The board 20 has the insulating layer 26 and the first layer wiring pattern 21. The first layer wiring pattern 21 is at least partially exposed outside the insulating layer 26. The MOSFETs 31-38 are mounted on the board 20 and electrically connected to the first layer wiring pattern 21.

The connector 70 has the PIG terminal 71 and the motor terminal 73 which are connected to the first layer wiring pattern 21.

The heatsink 80 is located opposite to the board 20 across the MOSFETs 31-38 and in contact with the MOSFETs 31-38 so that the heat generated in the MOSFETs 31-38 can be dissipated to the heatsink 80. For example, as described in the first embodiment, the heatsink 80 can be indirect contact with the MOSFETs 31-38 through the heat-dissipating gel 84. It is noted that the heatsink 80 can be either direct or indirect contact with the MOSFETs 31-38 as long as the heat generated in the MOSFETs 31-38 can be dissipated to the heatsink 80.

The first layer wiring pattern 21 includes the land pattern 211. The land pattern 211 has the mount portion 212, where the MOSFET 35 located adjacent to the connector 70 is mounted, and the PIG terminal hole 711, through which the PIG terminal 71 electrically connected to the MOSFET 35 is inserted. The first layer wiring pattern 21 further includes the land pattern 214. The land pattern 214 has the mount portion 215, where the MOSFET 37 located adjacent to the connector 70 is mounted, and the motor terminal hole, through which the motor terminal 73 electrically connected to the MOSFET 37 is inserted. According to the first embodiment, the MOSFET 35 is located adjacent to the connector 70 in such a manner that no device is mounted between the MOSFET 35 and the connector 70. Likewise, the MOSFET 37 is located adjacent to the connector 70 in such a manner that no device is mounted between the MOSFET 37 and the connector 70.

According to the first embodiment, the heatsink 80 is in contact with the MOSFETs 31-38 through the heat-dissipating gel 84 in such a manner that the heat generated in the MOSFETs 31-38 is dissipated to the heatsink 80.

The land pattern 211, where the MOSFET 35 located adjacent to the connector 70 is mounted, has a low impedance because the land pattern 211 has the PIG terminal hole 711. Thus, the heat generated in the MOSFET 35 is dissipated to the connector 70 through the land pattern 211 and the PIG terminal 71. Likewise, the land pattern 214, where the MOSFET 37 located adjacent to the connector 70 is mounted, has a low impedance because the land pattern 214 has the motor terminal hole, through which the motor terminal 73 is inserted. Thus, the heat generated in the MOSFET 37 is dissipated to the connector 70 through land pattern 214 and the motor terminal 73.

In this way, the heat generated in the MOSFETs 35 and 37, which are located adjacent to the connector 70, can be dissipated not only to the heatsink 80 side but also to the connector 70 side through the board 20. That is, the heat generated in the MOSFETs 35 and 37 can be dissipated not only from the heatsink 80 side but also from the board 20 side. Accordingly, the heatsink 80 and, by extension, the electronic control unit 1 as a whole can be reduced in size.

The board 20 is a multilayer board and includes multiple wiring patterns stacked on top of one another: the first layer wiring pattern 21, the second layer wiring pattern 22, the third layer wiring pattern 23, and the fourth layer wiring pattern 24.

The first layer wiring pattern 21 and the second layer wiring pattern 22 are stacked on top of each other across the insulating layer 26. The second layer wiring pattern 22 has the ground pattern 221 connected to the GND terminal 72 of the connector 70. The ground pattern 221 is equal to or greater in size than the land pattern 211 and overlaps the land pattern 211 in the thickness direction of the board 20.

The ground pattern 221 is equal to or greater in size than the land pattern 211 and entirely covers the land pattern 211 in the thickness direction of the board 20. Thus, the heat generated in the MOSFET 35 is transmitted to the ground pattern 221 through the land pattern 211 and the insulating layer 26. The same is true for the heat generated in the MOSFET 37. Further, since the ground pattern 221 is formed as a solid ground pattern and connected to the GND terminal 72, the heat transmitted to the ground pattern 221 can be dissipated from the GND terminal 72 to the connector 70 side. Thus, the heat transmitted from the MOSFET 35 can be dissipated from the GND terminal 72 which is electrically isolated from the MOSFET 35. Accordingly, the heat generated in the MOSFET 35 can be efficiently dissipated.

The heat-dissipating gel 84 has an electrically insulating property. The source terminal 354 electrically connected to the board 20 is exposed outside the molding resin 359 on the heatsink 80 side. Thus, the heat generated in the MOSFET 35 can be efficiently dissipated to the heatsink 80. The same is true for the heat generated in the MOSFETs 31-34, and 36-38.

The heatsink 80 has the pillar portions 83 by which the rooms 85, where the MOSFETs 31-38 are placed, are formed. The pillar portions 83 stand beside the MOSFETs 31-38 so that the heat generated in the MOSFETs 31-38 can be dissipated to the heatsink 80 from beside them.

Further, the pillar portions 83 are in contact with the board 20. Thus, heat generated in the board 20 can be dissipated to the heatsink 80.

The MOSFETs 31-38 include the driving MOSFETs 31-34 as driving devices. The electronic power steering apparatus 110 includes the electronic control unit 1 and the motor 101. The motor 101 is driven and controlled in accordance with ON and OFF switching of the driving MOSFETs 31-34, thereby producing assisting-torque to help a driver to steer the vehicle.

When the electronic control unit 1 is used in the electronic power steering apparatus 110, large current flows through the MOSFETs 31-38, and the amount of heat generation is large accordingly. According to the first embodiment, the heat generated in the MOSFETs 31-38 when they are energized is efficiently dissipated to the heatsink 80 and the connector 70 through the board 20. Thus, the heatsink 80 and, by extension, the electronic control unit 1 as a whole can be reduced in size.

Correspondence between terms used in the first embodiment and claims as follows. The land pattern 211 corresponds to a first land pattern.

The mount portion 212 corresponds to a mount portion. The PIG terminal hole 711 corresponds to a connection portion. The PIG terminal 71 corresponds to a connection terminal. The land pattern 214 corresponds to a first land pattern. The mount portion 215 corresponds to a mount portion. The motor terminal hole through which the motor terminal 73 is inserted corresponds to a connection portion. The motor terminal corresponds to a connection terminal. The GND terminal 72 corresponds to a ground terminal. The ground pattern 221 corresponds to a first ground pattern.

Second Embodiment

Figure 9:
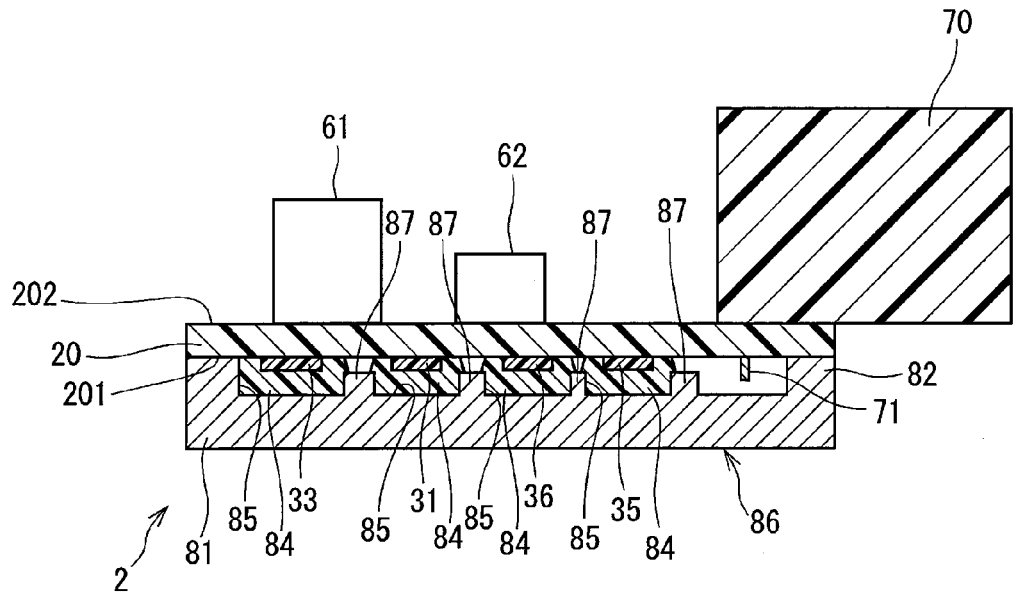
FIG. 9 is a diagram illustrating a cross-sectional view of an electronic control unit according to a second embodiment of the present disclosure.
Figure 10:
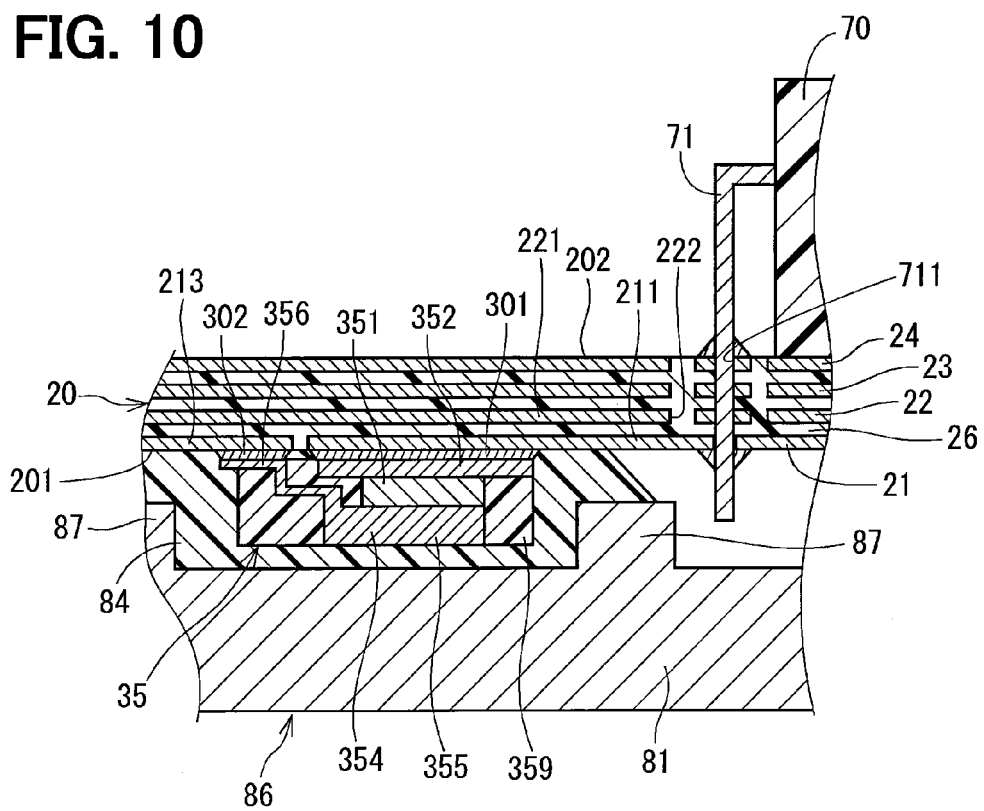
FIG. 10 is a diagram illustrating a cross-sectional view of a heat-generating device located adjacent to a connector according to the second embodiment of the present disclosure.

An electronic control unit 2 according to a second embodiment of the present embodiment is described below with reference to FIGS. 9 and 10. FIG. 9 corresponds to FIG. 4, and FIG. 10 corresponds to FIG. 5. The second embodiment is similar to but differs from the first embodiment as follows.

The electronic control unit 2 includes a heatsink 86 instead of the heatsink 80. Pillar portions 87 of the heatsink 86 differ in shape from the pillar portions 83 of the heatsink 80.

The pillar portions 87 project from the base portion 81 toward the board 20. For example, the pillar portions 87 are arranged in a grid. Tips of the pillar portions 87 are separated from the first surface 201 of the board 20. That is, there are spaces between the tips of the pillar portions 87 and the first surface 201 of the board 20. Therefore, unlike in the first embodiment, no green mask is formed on the first layer wiring pattern 21 of the board 20 at positions facing the pillar portions 87. Alternatively, like in the first embodiment, a green mask can be formed on the first layer wiring pattern 21 of the board 20 at positions facing the pillar portions 87.

Even in the structure described above, the same advantage as obtained in the first embodiment can be obtained.

Third Embodiment

Figure 11:
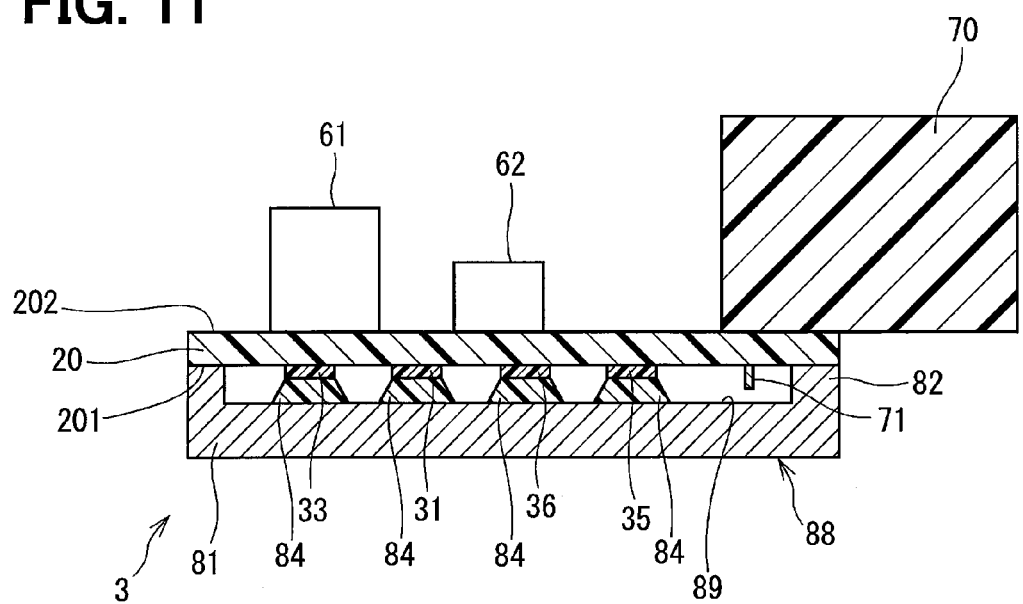
FIG. 11 is a diagram illustrating a cross-sectional view of an electronic control unit according to a third embodiment of the present disclosure.
Figure 12:
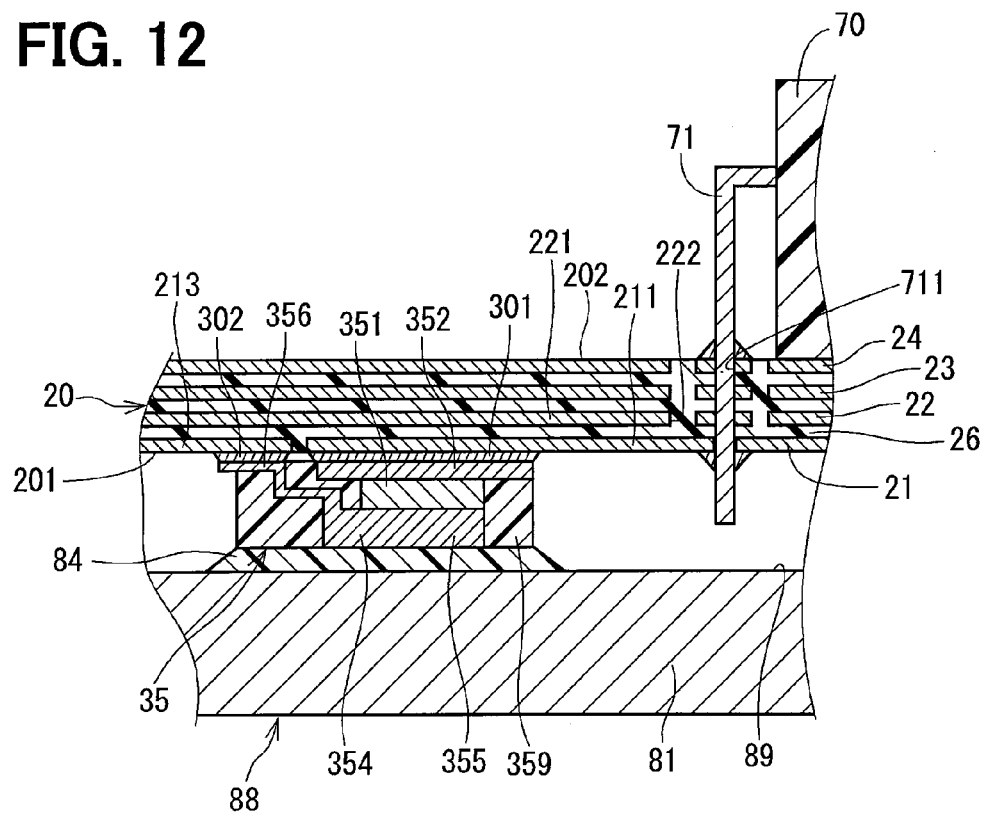
FIG. 12 is a diagram illustrating a cross-sectional view of a heat-generating device located adjacent to a connector according to the third embodiment of the present disclosure.

An electronic control unit 3 according to a third embodiment of the present embodiment is described below with reference to FIGS. 11 and 12. FIG. 11 corresponds to FIG. 4, and FIG. 12 corresponds to FIG. 5. The third embodiment is similar to but differs from the first embodiment as follows.

The electronic control unit 3 includes a heatsink 88 instead of the heatsink 80. Unlike the heatsink 80, the heatsink 88 does not have pillar portions. Accordingly, the heatsink 88 has a flat portion 89 at positions facing the MOSFETs 31-38. The heat-dissipating gel 84 is placed between the flat portion 89 and the MOSFETs 31-38.

In the structure described above, although the heat generated in the MOSFETs 31-38 are not dissipated to the heatsink 88 from beside the MOSFETs 31-38, the heat can be dissipated to the heatsink 88 from the back surfaces of the MOSFETs 31-38 in the same manner as described in the first embodiment. Further, since the heatsink 88 does not have pillar portions, the heatsink 88 can be manufactured easily compared to the heatsink 80. Accordingly, the number of man-hours required to manufacture the heatsink 88 can be reduced.

In addition, the same advantage as obtained in the preceding embodiments can be obtained.

Fourth Embodiment

Figure 13:
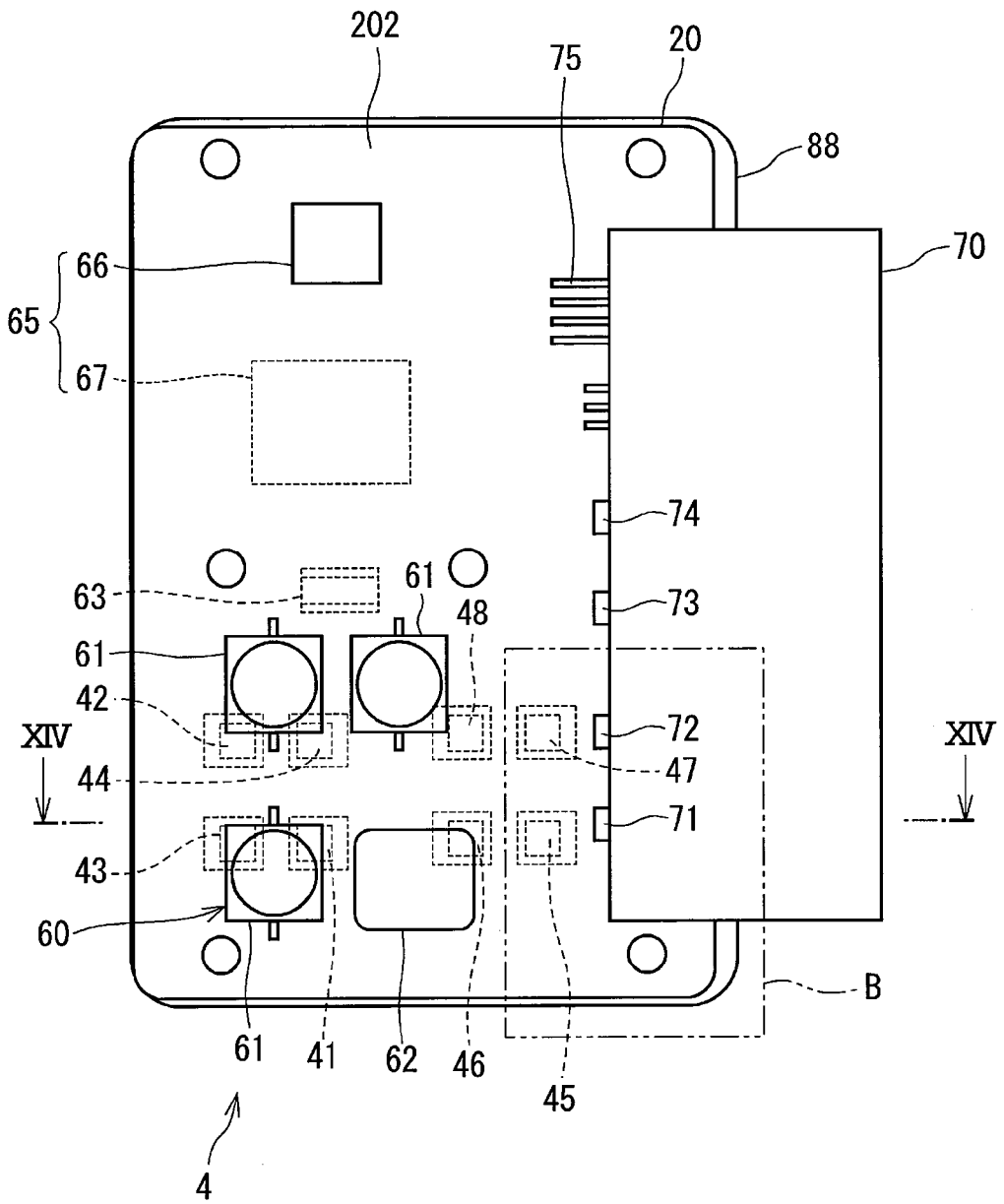
FIG. 13 is a diagram illustrating a plan view of an electric control unit according to a fourth embodiment of the present disclosure.
Figure 14:
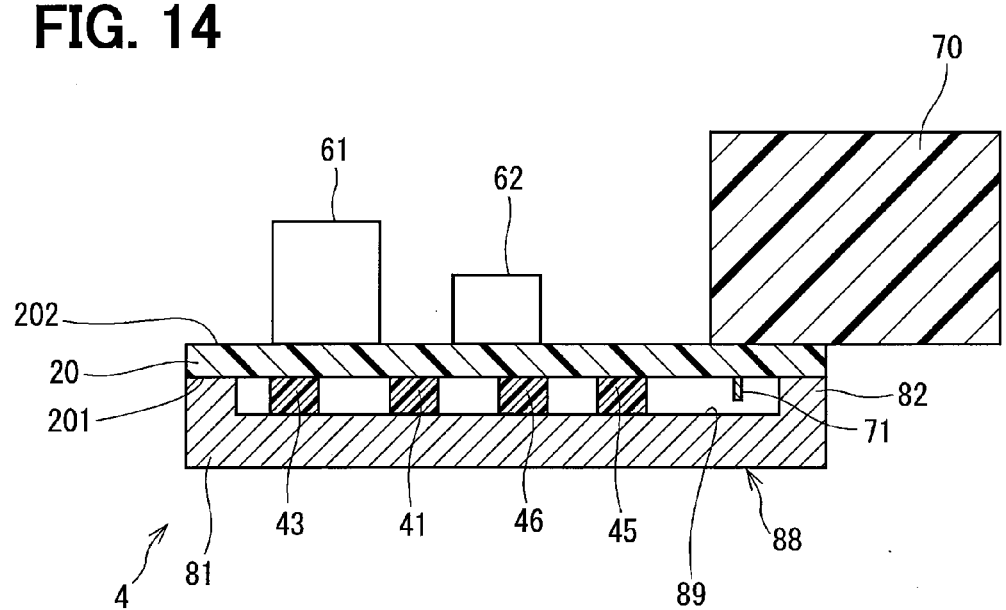
FIG. 14 is a diagram illustrating a cross-sectional view taken along line XIV-XIV in FIG. 13.

An electronic control unit 4 according to a fourth embodiment of the present embodiment is described below with reference to FIGS. 13-16. FIG. 13 corresponds to FIG. 3, and FIG. 14 corresponds to FIG. 4, and FIG. 15 corresponds to FIG. 5. FIG. 16 shows the first layer wiring pattern 21 in an area B in FIG. 13. The fourth embodiment is similar to but differs from the third embodiment as follows.

The electronic control unit 4 includes MOSFETs 41-48 instead of the MOSFETs 31-38. The MOSFETs 41-48 are identical in function with but differ in structure from the MOSFETs 31-38. Each of the MOSFETs 41-48 has the same structure. As an example, the structure of the MOSFET 45 is described.

Figure 15:
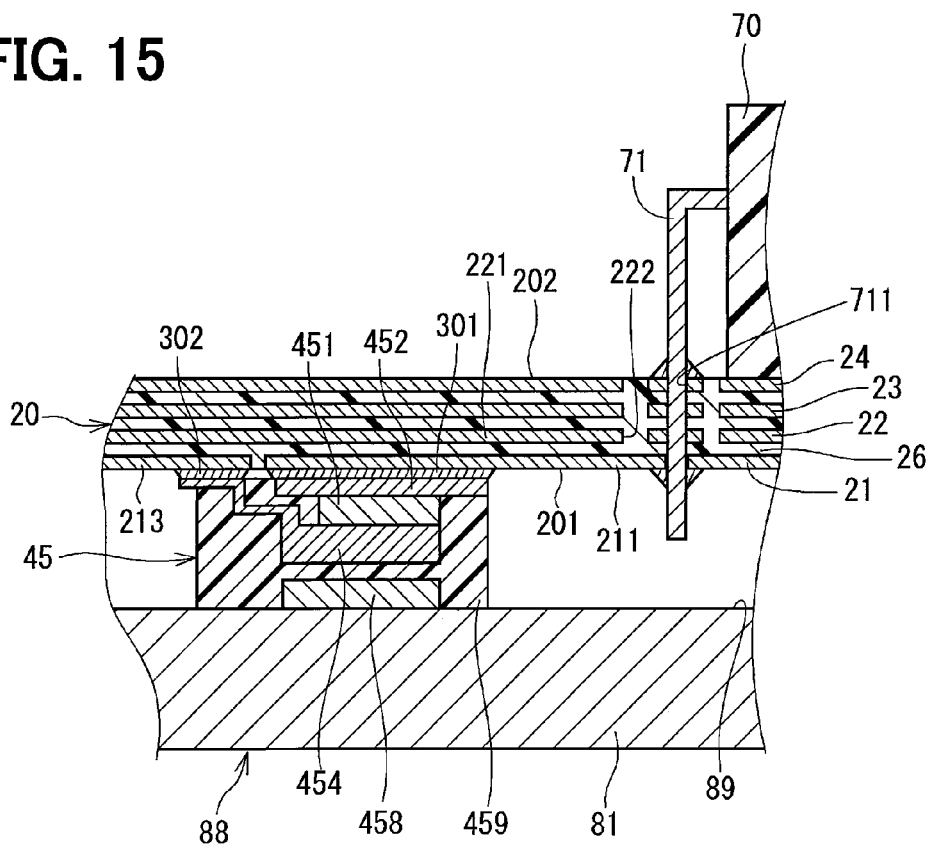
FIG. 15 is a diagram illustrating a cross-sectional view of a heat-generating device located adjacent to a connector according to the fourth embodiment of the present disclosure.
Figure 16:
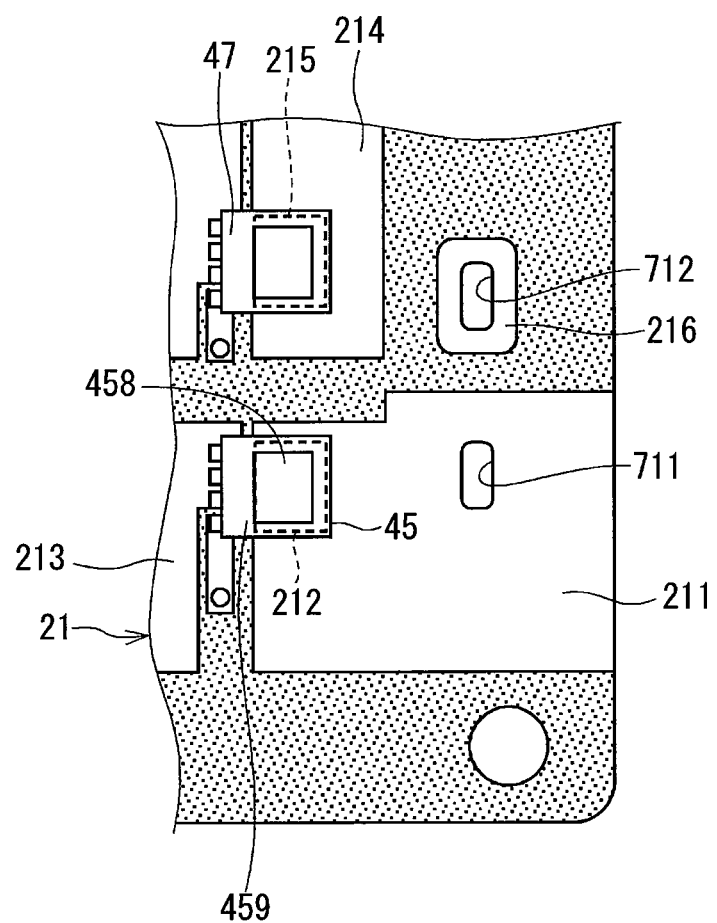
FIG. 16 is a diagram illustrating a plan view of a first layer wiring pattern according to the fourth embodiment of the present disclosure.

As shown in FIG. 15, the MOSFET 45 has a chip 451, a drain terminal 452, a source terminal 454 as a terminal portion, a slag 458, and a molding resin 459. The chip 451, the drain terminal 452, and the source terminal 454 of the MOSFET 45 are the same as the chip 351, the drain terminal 352, and the source terminal 354 of the MOSFET 35, respectively.

The slag 458 is exposed to a back surface of the molding resin 459 and in contact with the heatsink 88. The slag 458 has higher a heat conductivity than the molding resin 459. For example, the slag 458 is made of a metal such as tin. The molding resin 459 is interposed between the slag 458 and the source terminal 454 so that the slag 458 can be electrically isolated from the source terminal 454.

As described above, according to the fourth embodiment, the MOSFET 45 has the slag 458 which is exposed on the opposite side of the molding resin 459 from the board 20. Thus, heat generated in the MOSFET 45 when the MOSFET 45 is energized can be dissipated to the heatsink 88 efficiently.

Further, the slag 458 is in direct contact with the heatsink 88. Thus, the heat generated in the MOSFET 45 can be dissipated to the heatsink 88 from a back surface of the MOSFET 45. In addition, since no heat-dissipating gel is used in the electronic control unit 4, the number of parts in the electronic control unit 4 can be reduced.

In addition, the same advantage as obtained in the preceding embodiments can be obtained.

Fifth Embodiment

Figure 17:
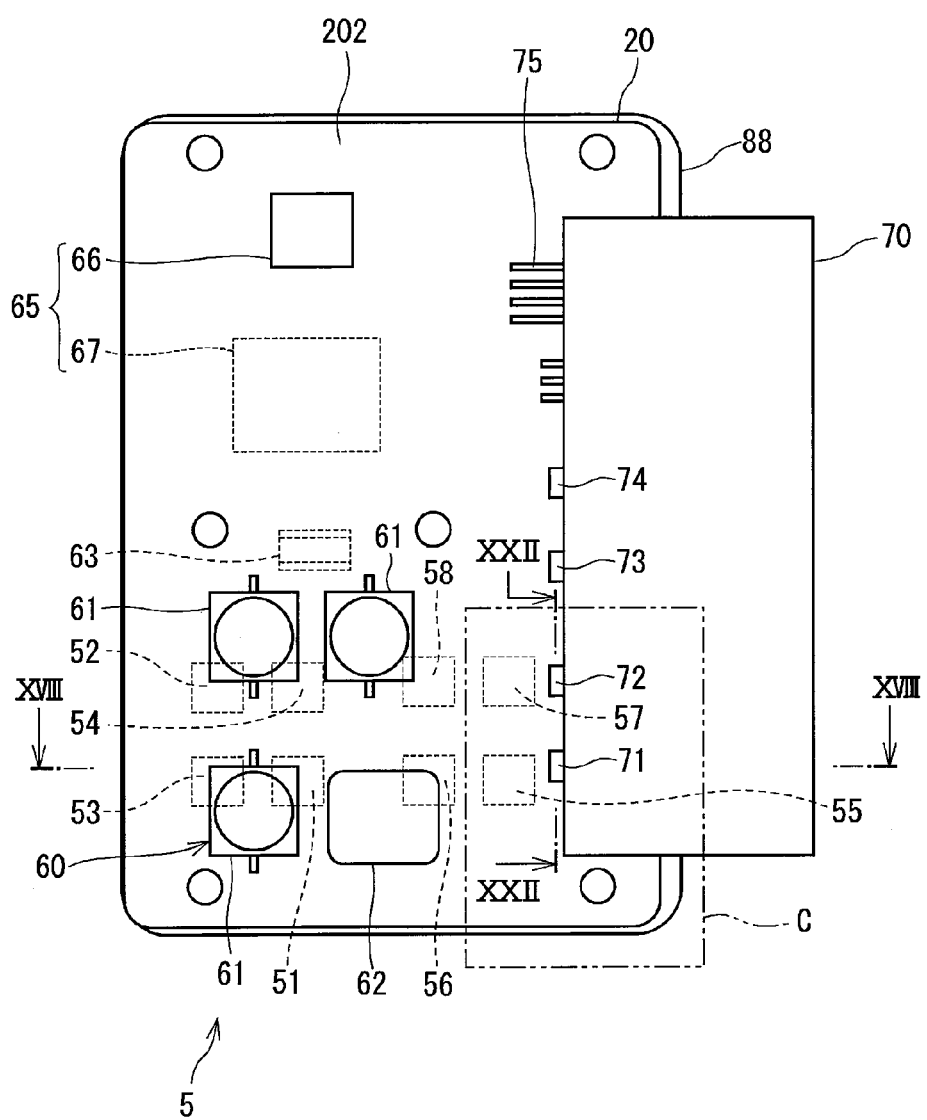
FIG. 17 is a diagram illustrating a plan view of an electric control unit according to a fifth embodiment of the present disclosure.
Figure 18:
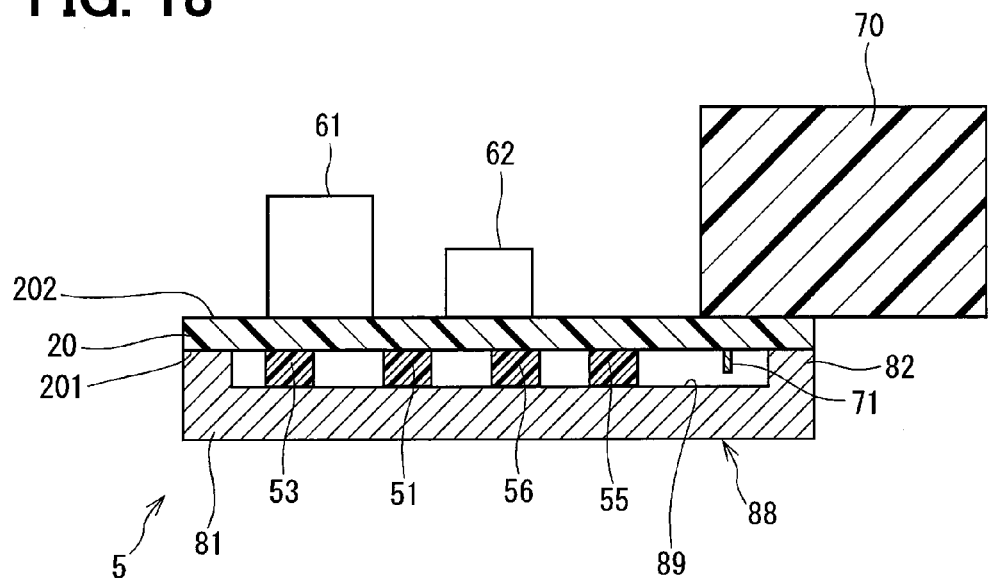
FIG. 18 is a diagram illustrating a cross-sectional view taken along line XVIII-XVIII in FIG. 17.

An electronic control unit 5 according to a fifth embodiment of the present embodiment is described below with reference to FIGS. 17-20. FIG. 17 corresponds to FIG. 3, FIG. 18 corresponds to FIG. 4, and FIG. 19 corresponds to FIG. 5. FIG. 20 shows the first layer wiring pattern 21 in an area C in FIG. 17. The fifth embodiment is similar to but differs from the fourth embodiment as follows.

The electronic control unit 5 includes MOSFETs 51-58 instead of the MOSFETs 41-48. The MOSFETs 51-58 are identical in function with but differ in structure from the MOSFETs 41-48. Each of the MOSFETs 51-58 has the same structure. As an example, the structure of the MOSFET 55 is described.

Figure 19:
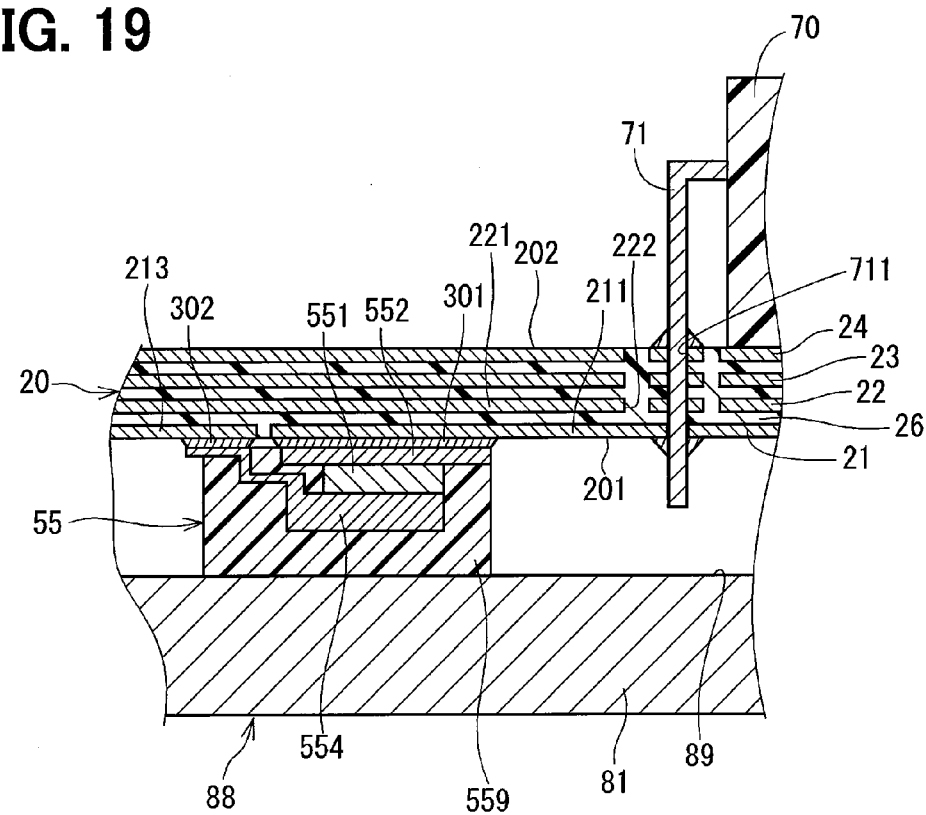
FIG. 19 is a diagram illustrating a cross-sectional view of a heat-generating device located adjacent to a connector according to the fifth embodiment of the present disclosure.
Figure 20:
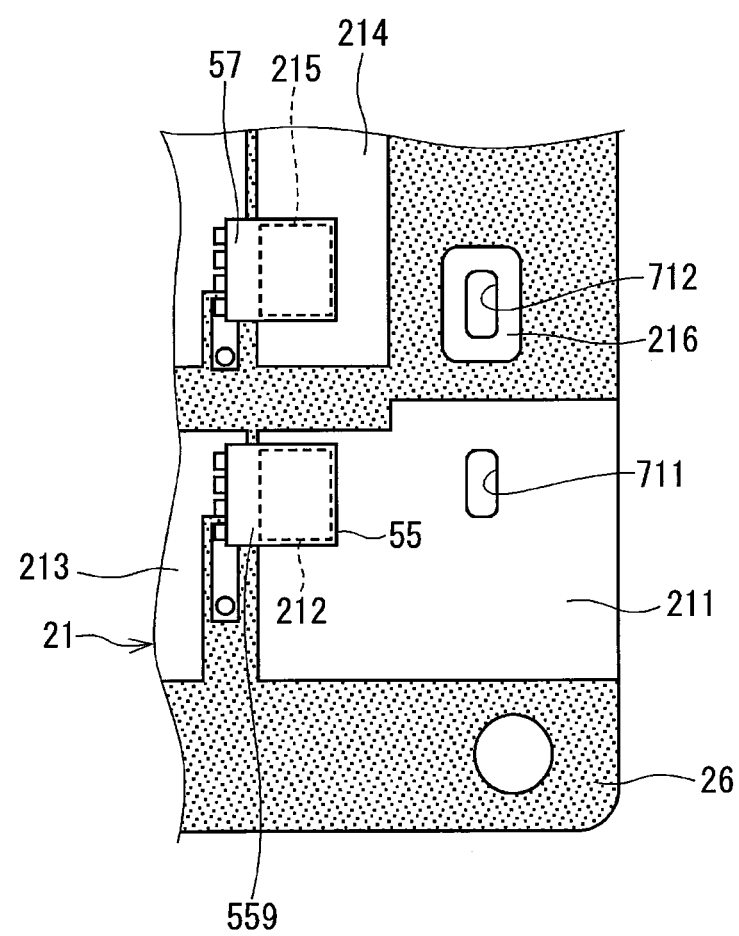
FIG. 20 is a diagram illustrating a plan view of a first layer wiring pattern according to the fifth embodiment of the present disclosure.

As shown in FIG. 19, the MOSFET 55 has a chip 551, a drain terminal 552, a source terminal 554 as a terminal portion, and a molding resin 559. The chip 551, the drain terminal 552, and the source terminal 554 of the MOSFET 55 are the same as the chip 451, the drain terminal 452, and the source terminal 454 of the MOSFET 45, respectively.

A back surface of the MOSFET 55 is defined by the molding resin 559. In other word, there is no source terminal and slag exposed to a back surface of the molding resin 559. The MOSFET 55 is in direct contact with the heatsink 88 at the molding resin 559.

Even in the structure described above, heat generated in the MOSFET 55 when the MOSFET 55 is energized can be dissipated to the heatsink 88 from the back surface of the MOSFET 55.

In addition, the same advantage as obtained in the preceding embodiments can be obtained.

Sixth Embodiment

Figure 21:
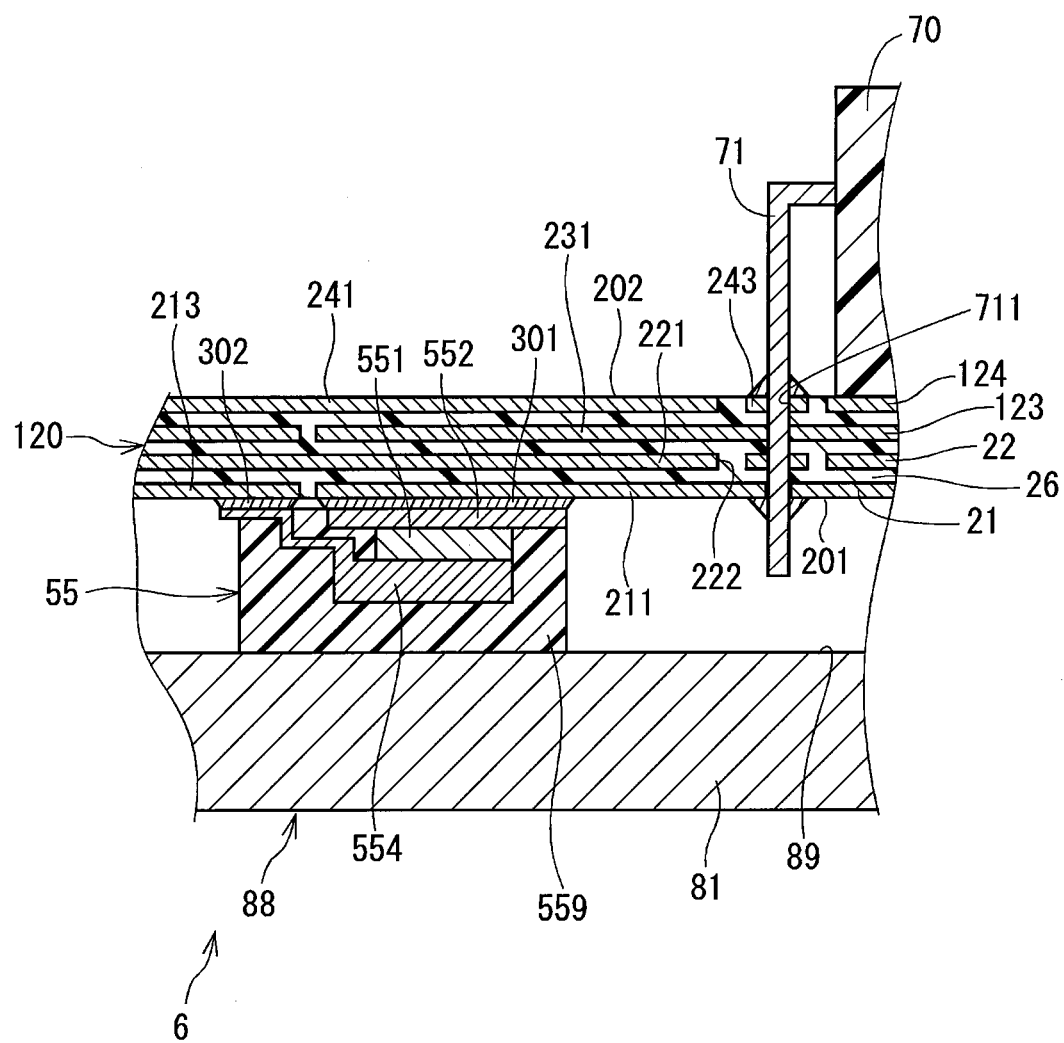
FIG. 21 is a diagram illustrating a cross-sectional view of a heat-generating device located adjacent to a connector according to a sixth embodiment of the present disclosure.
Figure 22:
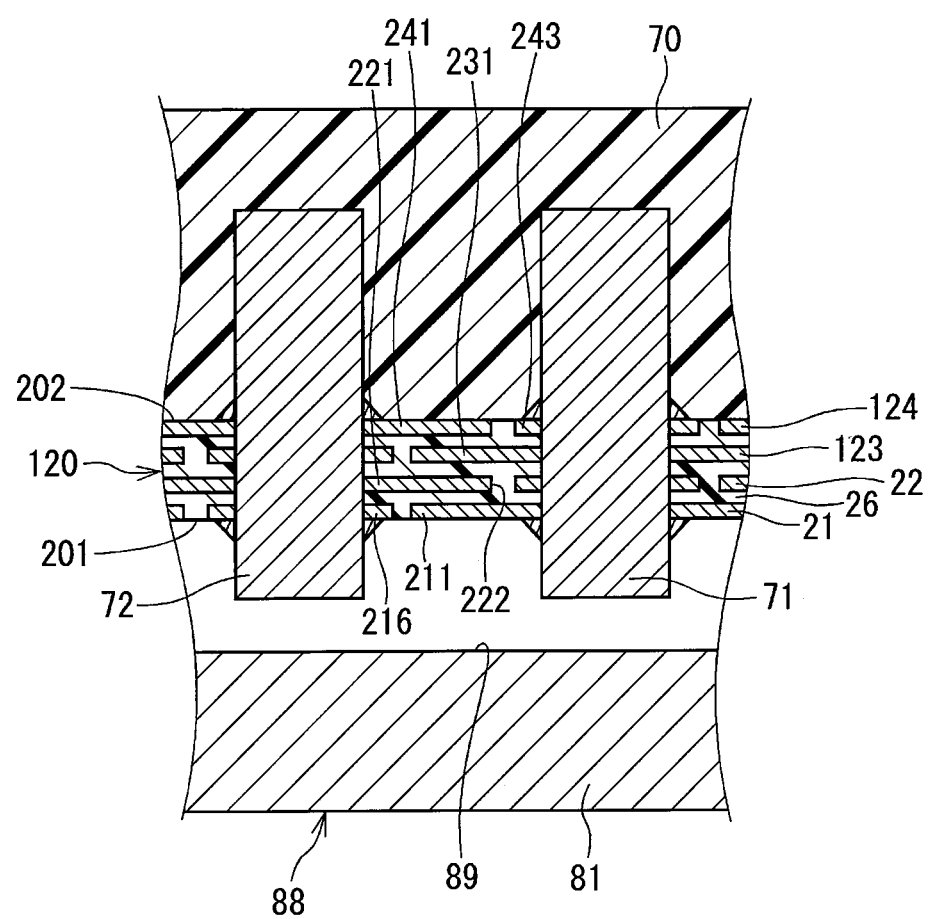
FIG. 22 is a diagram illustrating a plan view of a wiring pattern according to the sixth embodiment of the present disclosure.
Figure 23:
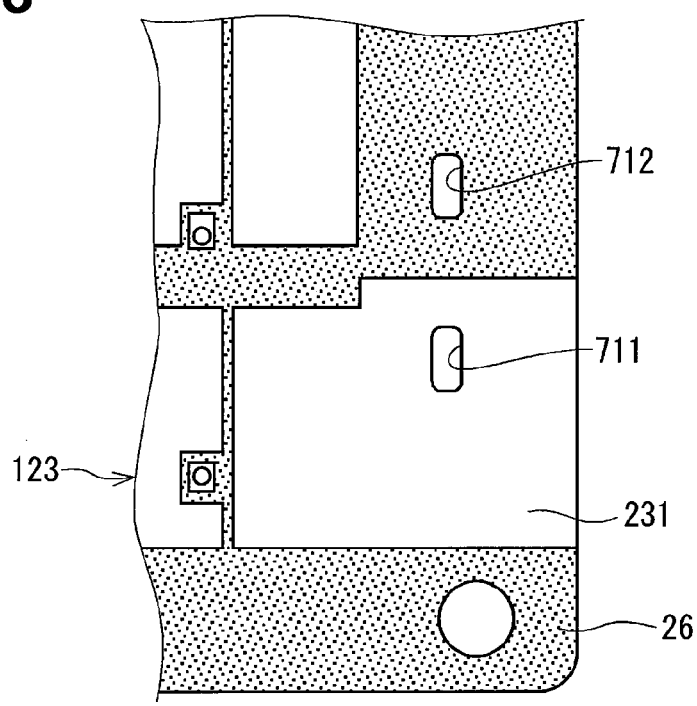
FIG. 23 is a diagram illustrating a plan view of a third layer wiring pattern according to the sixth embodiment of the present disclosure.
Figure 24:
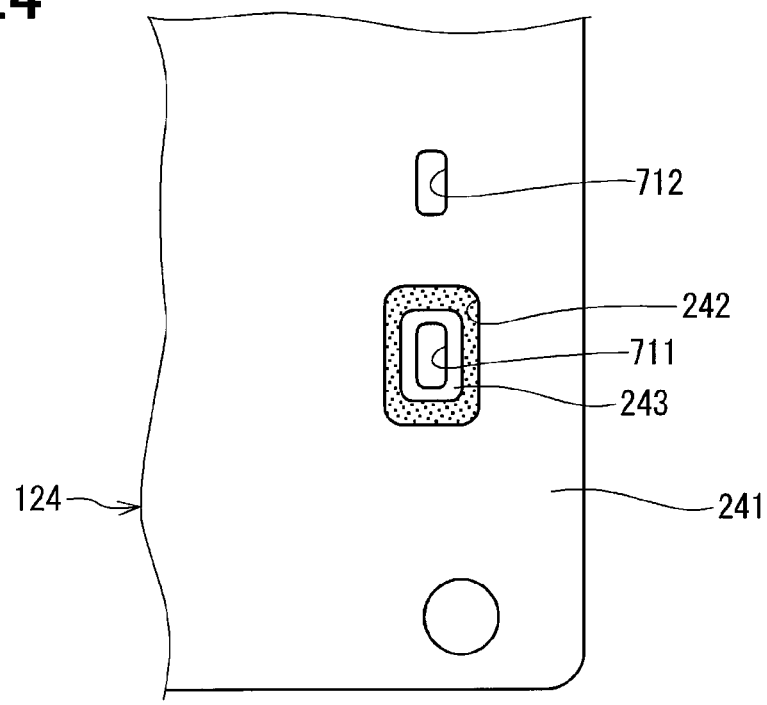
FIG. 24 is a diagram illustrating a plan view of a fourth layer wiring pattern according to the sixth embodiment of the present disclosure.

An electronic control unit 6 according to a sixth embodiment of the present embodiment is described below with reference to FIGS. 21-24. FIG. 21 corresponds to FIG. 19. FIG. 22 is a cross-sectional view taken along a line corresponding to the line XXII-XXII in FIG. 17. FIG. 23 shows a third layer wiring pattern 123 in an area corresponding to the area C in FIG. 17. FIG. 24 shows a fourth layer wiring pattern 124 in the area corresponding to the area C in FIG. 17. The sixth embodiment is similar to but differs from the fifth embodiment as follows.

The electronic control unit 6 includes a board 120 instead of the board 20. The board 120 has a third layer wiring pattern 123 and a fourth layer wiring pattern 124 instead of the third layer wiring pattern 23 and the fourth layer wiring pattern 24. That is, the board 120 has the first layer wiring pattern 21, the second layer wiring pattern 22, the third layer wiring pattern 123, and the fourth layer wiring pattern 124.

As shown in FIG. 23, the third layer wiring pattern 123 has a land pattern 231. The land pattern 231 spreads flatly over the third layer wiring pattern 123 so that the land pattern 231 can overlap the land pattern 211 of the first layer wiring pattern 21 in a thickness direction of the board 120. The land pattern 231 is equal to or greater in size than the land pattern 211. The land pattern 231 has the PIG terminal hole 711. The PIG terminal 71 is inserted through the PIG terminal hole 711 and electrically connected to the land pattern 231.

As shown in FIG. 24, the fourth layer wiring pattern 124 has a ground pattern 241, a separation portion 242, and a land 243 surround by the separation portion 242. The ground pattern 241 is a so-called solid ground pattern and spreads flatly almost all over the fourth layer wiring pattern 124. The separation portion 242 prevents terminals including the PIG terminal 71, which must be electrically isolated from the ground pattern 241, from being short-circuited. The ground pattern 241 has the GND terminal hole 712. The GND terminal 72 is inserted through the GND terminal hole 712 and electrically connected to the ground pattern 241. The ground pattern 241 overlaps the land pattern 231 of the third layer wiring pattern 123 in the thickness direction of the board 120. Further, the ground pattern 241 is equal to or greater in size than the land pattern 231. The land 243 has the PIG terminal hole 711. The land 243 is located inside the separation portion 242 and electrically isolated from the ground pattern 241.

Next, a heat-dissipation path through which heat generated in the MOSFET 55 at the time of switching is dissipated is described below. Like in the preceding embodiments, the heat generated in the MOSFET 55 is dissipated to the heatsink 88 from the back surface of the MOSFET 55. Further, the heat generated in the MOSFET 55 is dissipated from the drain terminal 552 to the connector 70 side through the land pattern 211 and the PIG terminal 71. Furthermore, the heat generated in the MOSFET 55 is dissipated from the land pattern 211 to the connector 70 side through the insulating layer 26, the ground pattern 221, and the GND terminal 72.

In addition, the land pattern 231 is connected to the PIG terminal 71 and spreads flatly over the area where the land pattern 211 spreads. Thus, the heat generated in the MOSFET 55 is transmitted to the land pattern 231 through the PIG terminal 71. The land pattern 231 is sandwiched between the ground patterns 221 and 241 as solid ground patterns across the insulating layer 26. Therefore, the heat transmitted to the land pattern 231 can be dissipated to the connector 70 side through the ground patterns 221 and 241 and the GND terminal 72.

The sixth embodiment is summarized below. The board 120 includes the third layer wiring pattern 123. The third layer wiring pattern 123 is stacked through the insulating layer 26 on the opposite side of the second layer wiring pattern 22 from the first layer wiring pattern 21.

The third layer wiring pattern 123 has the land pattern 231. The land pattern 231 is equal to or greater in size than the land pattern 211 and overlaps the land pattern 211 in the thickness direction of the board 120. The land pattern 231 has the PIG terminal hole 711 as a connection portion where the land pattern 231 is connected to the PIG terminal 71.

The heat generated in the MOSFET 55 is transmitted to the land pattern 231 through the land pattern 211 and the PIG terminal 71. Thus, the total area of the land patterns to which the heat generated in the MOSFET 55 is transmitted is increased. Accordingly, the heat is distributed over a larger area and dissipated more efficiently.

The board 120 further includes the fourth layer wiring pattern 124. The fourth layer wiring pattern 124 is stacked through the insulating layer 26 on the opposite side of the third layer wiring pattern 123 from the second layer wiring pattern 22. The fourth layer wiring pattern 124 has the ground pattern 241. The ground pattern 241 is equal to or greater in size than the land pattern 231 and overlaps the land pattern 231 in the thickness direction of the board 120. The ground pattern 241 is connected to the GND terminal 72.

Thus, the heat transmitted to the land pattern 231 through the land pattern 211 and the PIG terminal 71 is transmitted through the insulating layer 26 to the ground patterns 221 and 241, which are located on different sides of the land pattern 231, and then dissipated to the connector 70 through the GND terminal 72. Accordingly, the heat generated in the MOSFET 55 is dissipated more efficiently.

In addition, the same advantage as obtained in the preceding embodiments can be obtained.

Correspondence between terms used in the sixth embodiment and claims as follows. The land pattern 231 corresponds to a second land pattern. The ground pattern 241 corresponds to a second ground pattern.

Seventh Embodiment

Figure 25:
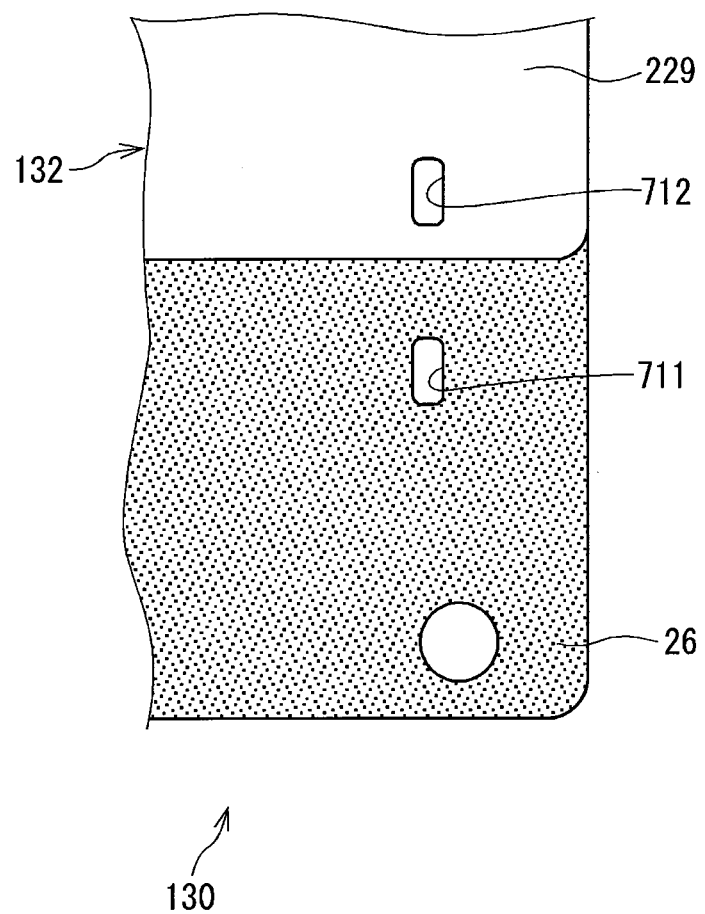
FIG. 25 is a diagram illustrating a plan view of a second layer wiring pattern according to a seventh embodiment of the present disclosure.

An electronic control unit according to a seventh embodiment of the present embodiment is described below with reference to FIG. 25. FIG. 25 shows a second layer wiring pattern 132 in an area corresponding to the area C in FIG. 17. The seventh embodiment is similar to but differs from the fifth embodiment as follows.

The electronic control unit according to the seventh embodiment includes a board 130 instead of the board 20. The board 130 has the second layer wiring pattern 132 instead of the second layer wiring pattern 22. As shown in FIG. 25, the second layer wiring pattern 132 has a ground pattern 229. The ground pattern 229 is shaped so that it cannot overlap the land pattern 211 in the thickness direction of the board 130. In this case, although the heat generated in the MOSFET 55 is not dissipated through the second layer wiring pattern 132 and the GND terminal 72, the heat can be dissipated to the connector 70 side through the land pattern 211 and the PIG terminal 71. Thus, the heat generated in the MOSFET 55 can be dissipated not only to the heatsink 88 from the back surface of the MOSFET 55 but also to the connector 70 through the board 130 and the PIG terminal 71.

In addition, the same advantage as obtained in the preceding embodiments can be obtained.

Eighth Embodiment

Figure 26:
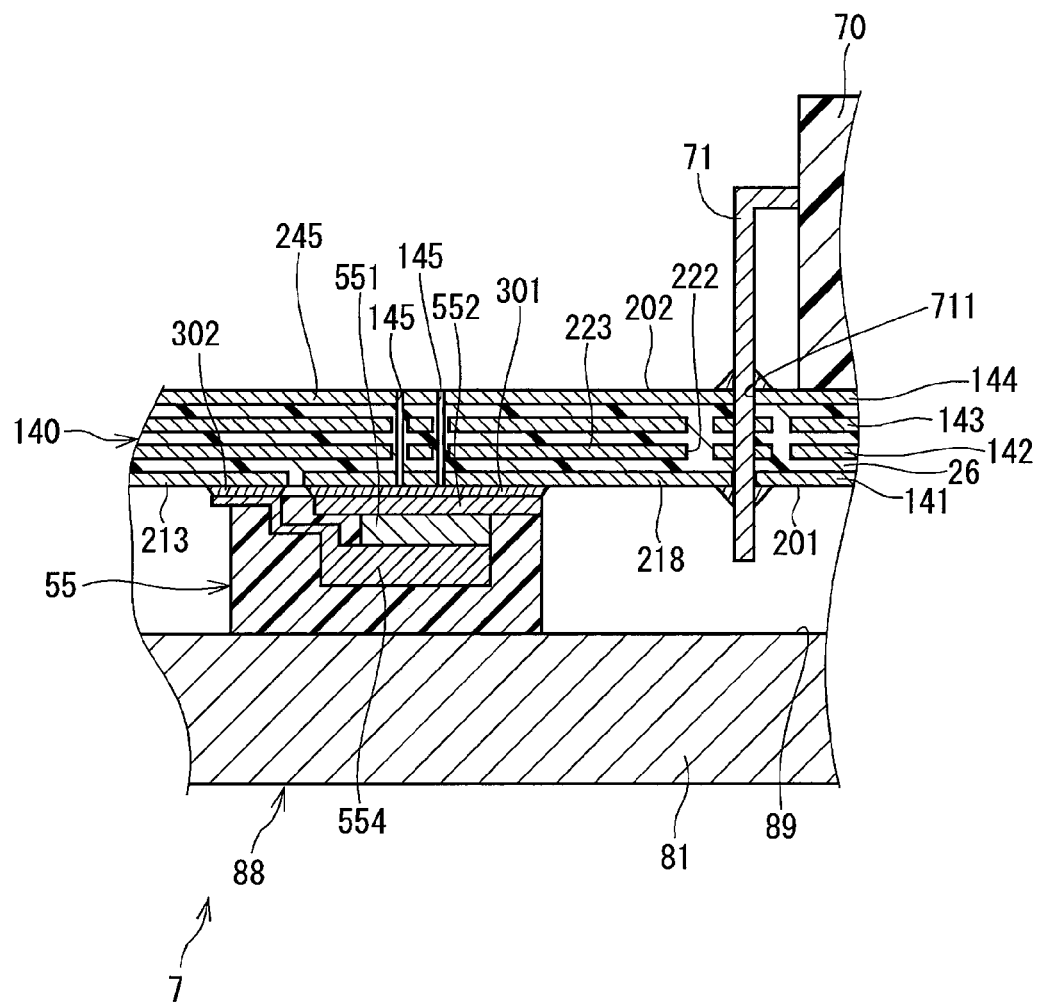
FIG. 26 is a diagram illustrating a cross-sectional view of a heat-generating device located adjacent to a connector according to an eighth embodiment of the present disclosure.
Figure 27:
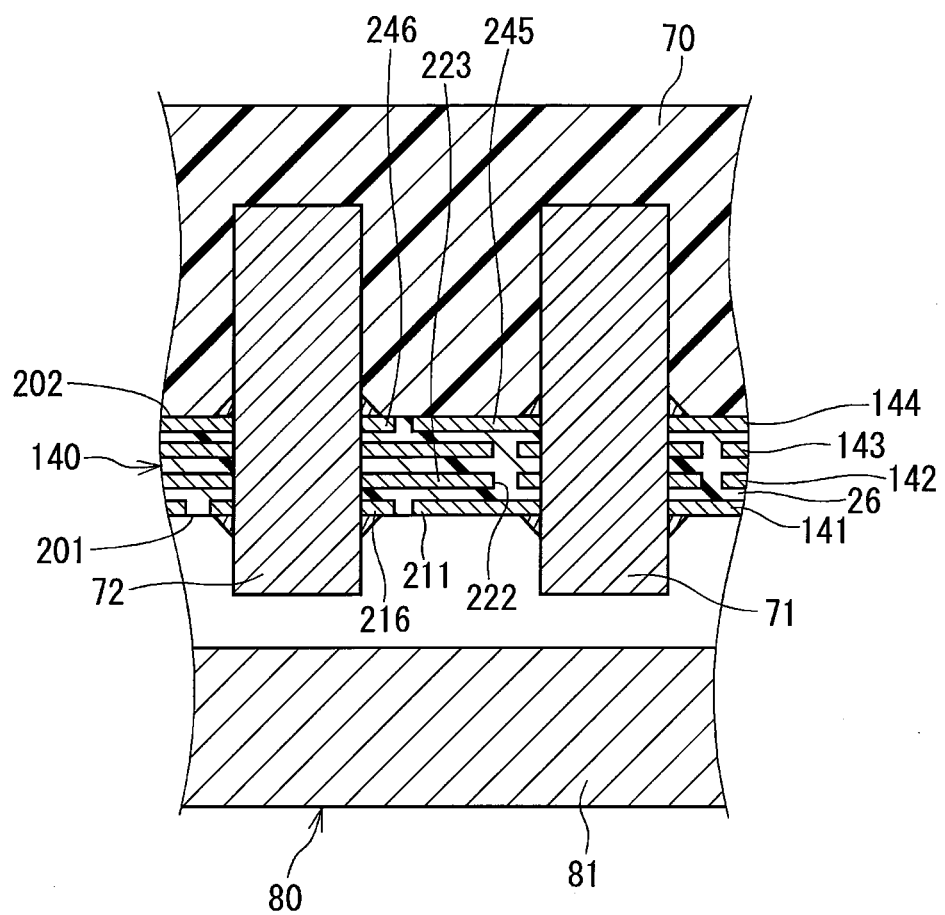
FIG. 27 is a diagram illustrating a cross-sectional view of wiring patterns according to the eighth embodiment of the present disclosure.
Figure 28:
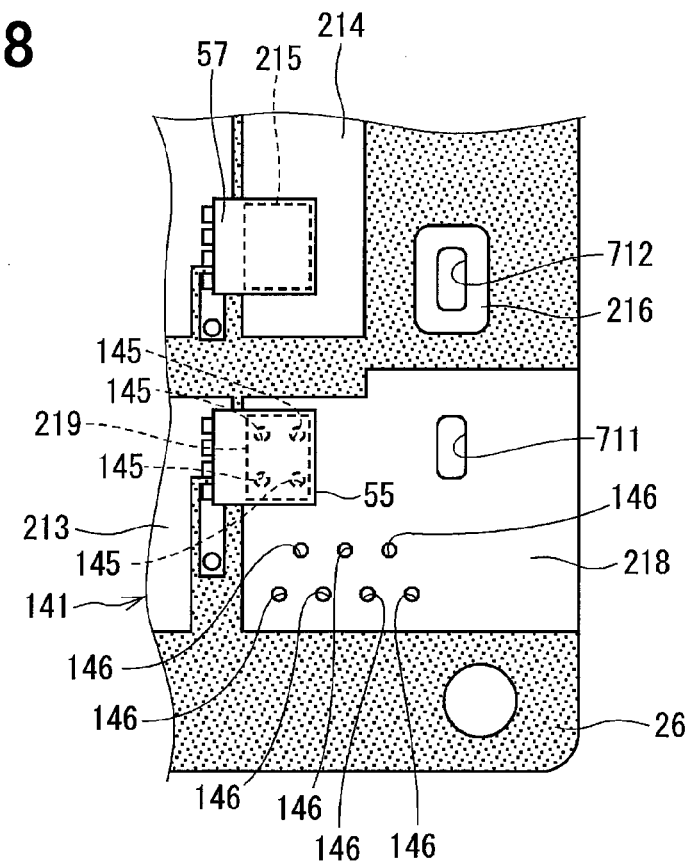
FIG. 28 is a diagram illustrating a plan view of a first layer wiring pattern according to the eighth embodiment of the present disclosure.
Figure 29:
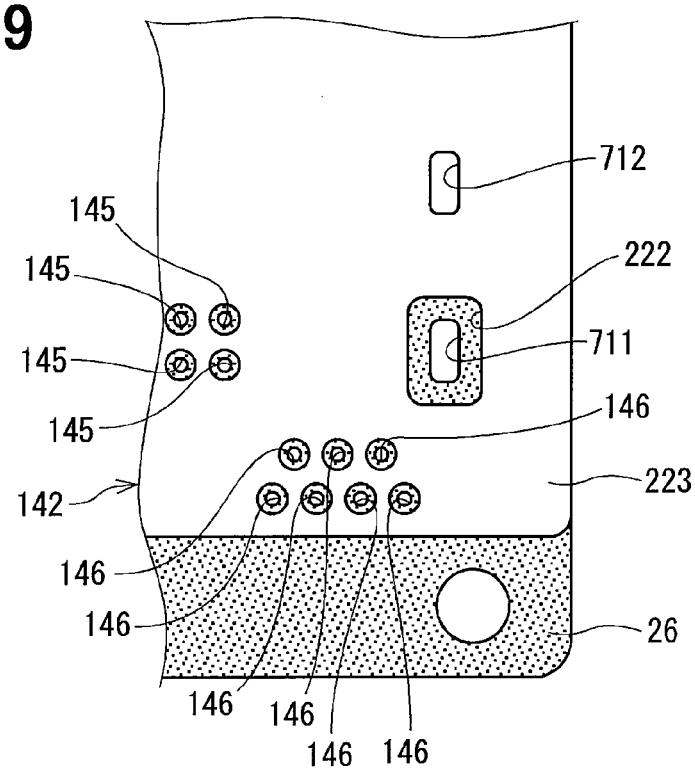
FIG. 29 is a diagram illustrating a plan view of a second layer wiring pattern according to the eighth embodiment of the present disclosure.
Figure 30:
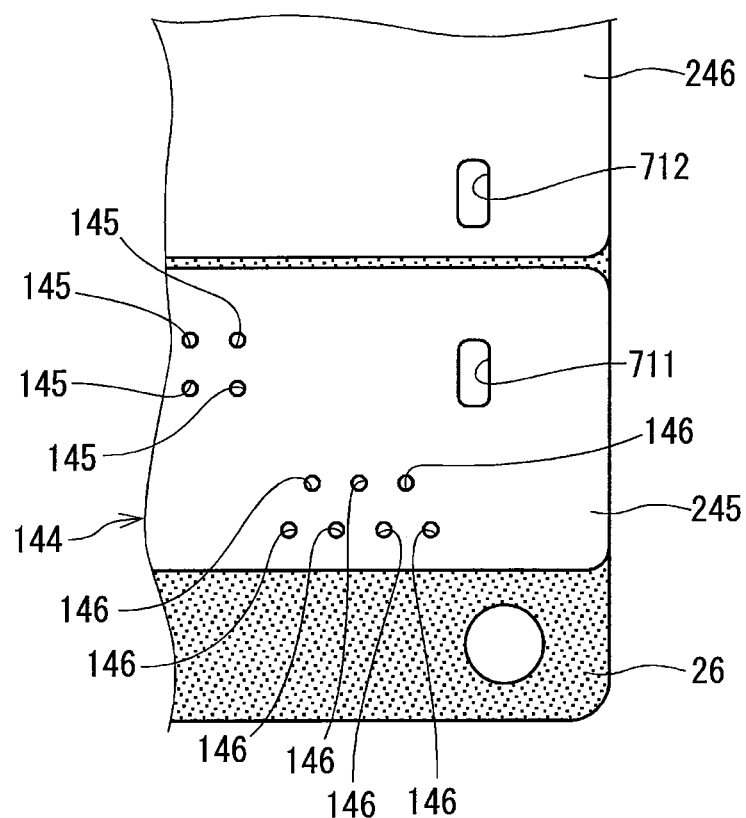
FIG. 30 is a diagram illustrating a plan view of a fourth layer wiring pattern according to the eighth embodiment of the present disclosure.

An electronic control unit 7 according to an eighth embodiment of the present embodiment is described below with reference to FIGS. 26-30. FIG. 26 corresponds to FIG. 19. FIG. 27 corresponds to FIG. 19. FIG. 28 shows a first layer wiring pattern 141 in an area corresponding to the area C in FIG. 17. FIG. 29 shows a second layer wiring pattern 142 in the area corresponding to the area C in FIG. 17. FIG. 30 shows a fourth layer wiring pattern 144 in the area corresponding to the area C in FIG. 17. The eighth embodiment is similar to but differs from the fifth embodiment as follows.

The electronic control unit 7 includes a board 140 instead of the board 20. As shown in FIGS. 26 and 27, the board 140 includes four layer wiring patterns arranged from the first surface 201 side, where the MOSFETs 51-58 are mounted, in the following order: a first layer wiring pattern 141, a second layer wiring pattern 142, a third layer wiring pattern 143, and a fourth layer wiring pattern 144.

As shown in FIGS. 26 and 28, a land pattern 218 of the first layer wiring pattern 141 is similar to but differs from the land pattern 211 in that vias 145 and 146 are formed in the land pattern 218. The land pattern 218 has a mount portion 219 where the drain terminal 552 is mounted. For example, four vias 145 are formed in the mount portion 219 of the land pattern 218, and seven vias 146 are formed in a non-mount portion of the land pattern 218. The non-mount portion is a region where the drain terminal 552 is not mounted. Although not shown in the drawings, vias can be formed in land patterns where the MOSFETs 51-54, and 56-58 are mounted.

As shown in FIGS. 26 and 30, the vias 145 and 146 extend through the board 140 and electrically connect the land pattern 218 of the first layer wiring pattern 141 to a land pattern 245 of the fourth layer wiring pattern 144. The land pattern 245 has the PIG terminal hole 711. The PIG terminal 71 is inserted though the PIG terminal hole 711 and electrically connected to the land pattern 245. A ground pattern 246 of the fourth layer wiring pattern 144 has the GND terminal hole 712. The GND terminal 72 is inserted though the GND terminal hole 712 and electrically connected to the ground pattern 246. The ground pattern 246 is separated from the land pattern 245 and electrically disconnected from the land pattern 245.

The land pattern 245 is equal to or greater in size than the land pattern 218 and overlaps the land pattern 218 in the thickness direction of the board 140. Thus, the heat generated in the MOSFET 55 is transmitted to the land pattern 245 through the vias 145 and 146. The heat transmitted to the land pattern 245 is dissipated to the connector 70 through the PIG terminal 71.

Since the land pattern 218 and the land pattern 245 are electrically connected to each other through the vias 145 and 146, the total area of the land patterns to which the MOSFET 55 is electrically connected is increased. Accordingly, the heat is dissipated efficiently.

As shown in FIGS. 26 and 29, a ground pattern 223 of the second layer wiring pattern 142 is similar to but differs from the ground pattern 221 in that the vias 145 and 146 are formed in the ground pattern 223. Each of the vias 145 and 146 is surrounded by the insulating layer 26 so that the vias 145 and 146 can be electrically disconnected from the ground pattern 223. Thus, the vias 145 and 146 do not electrically connect the land pattern 218 of the first layer wiring pattern 141 to the ground pattern 223 of the second layer wiring pattern 142.

Likewise, in the third layer wiring pattern 143, each of the vias 145 and 146 is surrounded by the insulating layer 26 so that the vias 145 and 146 can be electrically disconnected from the third layer wiring pattern 143. Thus, the vias 145 and 146 do not electrically connect the land pattern 218 of the first layer wiring pattern 141 to the third layer wiring pattern 143.

As described above, according to the eighth embodiment, the board 140 has the vias 145 and 146. The vias 145 and 146 electrically connect the land pattern 218 of the first layer wiring pattern 141 to the land pattern 245 of the fourth layer wiring pattern 144 which is located at a different level from the first layer wiring pattern 141. The heat generated in the MOSFETs 51-58 are transmitted to the land pattern 245 of the fourth layer wiring pattern 144 through the vias 145 and 146. Thus, the total area of the board 140 to which the heat generated in the MOSFETs 51-58 is transmitted is increased. Accordingly, the heat is distributed over a larger area and dissipated more efficiently.

In addition, the same advantage as obtained in the preceding embodiments can be obtained.

Correspondence between terms used in the eighth embodiment and claims as follows. The land pattern 218 corresponds to a first land pattern. The ground pattern 223 corresponds to a first ground pattern.

(Modifications)

While the present disclosure has been described with reference to the embodiments, it is to be understood that the disclosure is not limited to the embodiments. The present disclosure is intended to cover various modifications and equivalent arrangements within the spirit and scope of the present disclosure. For example, the embodiments can be modified as follows.

In the eighth embodiment, the vias are formed in both the mount portion and the non-mount portion. Alternatively, the vias can be formed in only one of the mount portion and the non-mount portion. The number of the vias is not limited to that described in the eighth embodiment. The vias can electrically connect the first layer wiring pattern to the second layer wiring pattern and/or the third layer wiring pattern instead of or in addition to the fourth layer wiring pattern.

The vias can be formed in the board described in any of the first to seventh embodiments to connect the first layer wiring pattern to any other layer wiring pattern.

In the fourth to eighth embodiments, the heat-generating device is in direct contact with the heatsink. Alternatively, the heat-generating device can be in indirect contact with the heatsink through a heat-dissipating member. The heat-dissipating gel can replaced with any other heat-dissipating member capable of dissipating heat of the heat-generating device to the heatsink. For example, a heat-dissipating sheet can be used instead of the heat-dissipating gel.

In the first and second embodiments, each MOSFET is placed in an individual room. Alternatively, multiple MOSFETs can be placed in one room.

In the embodiments, the PS-relay MOSFET and the motor-relay MOSFET out of the heat-generating devices are located adjacent to the connector. For example, when one of the PS-relay MOSFET and the motor-relay MOSFET is not included, the driving MOSFET can be located adjacent to the connector. The heat-generating device is not limited to the MOSFET. For example, the heat-generating device can be an insulated-gate bipolar transistor (IGBT). The coil and the shunt resistor can be considered as the heat-generating device.

In the embodiments, the heat-generating device is a switching device having the drain terminal mounted on the first land pattern and having the source terminal located on the heatsink side across the chip. The heat-generating device is not limited to this structure, as long as a part of its metal terminal is exposed to the board side and connected to the first land pattern.

In the embodiments, the solid ground patterns of the second layer wiring pattern and the fourth layer wiring pattern are greater than the first land pattern or the second land pattern and overlaps the first land pattern or the second land pattern in the thickness direction of the board. Alternatively, at least of the solid ground patterns of the second layer wiring pattern and the fourth layer wiring pattern can be substantially equal in size to the first land pattern or the second land pattern.

In the embodiments, the number of wiring patterns in the board is four. The number of wiring patterns in the board is not limited to four and can be any number, as long as the board has the first layer wiring pattern.

In the embodiments, a driving circuit to drive the motor is an H-bridge circuit constructed with the driving MOSFETs. Alternatively, the driving circuit can be a three-phase inverter or the like.

In the embodiments, the electronic control unit is used in a so-called rack-assist type electric power steering apparatus in which the assisting-torque of the motor is outputted to a rack shaft. Alternatively, the electronic control unit can be used in a column-assist type electric power steering apparatus or the like in which the assisting-torque of the motor is outputted to a portion other than a rack shaft. Further, the electronic control unit can be used in an apparatus other than an electric power steering apparatus.

Such changes and modifications are to be understood as being within the scope of the present disclosure as defined by the appended claims.

What is claimed is:

1. An electronic control unit comprising:
   a board having a first insulating layer and a first layer wiring pattern partially exposed outside the first insulating layer;
   a heat-generating device mounted on the board and electrically connected to the first layer wiring pattern;
   a connector located adjacent to the heat-generating device and having a connection terminal connected to the first layer wiring pattern, and
   a heatsink located opposite to the board across the heat-generating device and in contact with the heat-generating device to dissipate heat of the heat-generating device, wherein
   the first layer wiring pattern has a first land pattern including a mount portion and a connection portion, the heat-generating device is mounted on the mount portion of the first land pattern, and the connection terminal of the connector is connected to the connection portion of the first land pattern.

2. The electronic control unit according to claim 1, wherein the board is a multilayer board having a plurality of insulating layers and a plurality of wiring patterns, the plurality of insulating layers alternates with the plurality of wiring patterns, the first insulating layer is one of the plurality of insulating layers, and the first layer wiring pattern is one of the plurality of wiring patterns.

3. The electronic control unit according to claim 2, wherein the board has a via which electrically connects the first land pattern to at least one of the plurality of wiring patterns except the first layer wiring pattern.

4. The electronic control unit according to claim 2, wherein the plurality of wiring patterns includes a second layer wiring pattern, the plurality of insulating layers includes a second insulating layer, the second layer wiring pattern is stacked on the first layer wiring pattern across the second insulating layer, the second layer wiring pattern has a first ground pattern connected to a ground terminal of the connector, and the first ground pattern overlaps the first land pattern and is equal to or greater in size than the first land pattern.

5. The electronic control unit according to claim 4, wherein the plurality of wiring patterns includes a third layer wiring pattern, the plurality of insulating layers includes a third insulating layer, the third layer wiring pattern is stacked on the second layer wiring pattern across the third insulating layer, the third layer wiring pattern has a second land pattern connected to the connection terminal of the connector, and the second land pattern overlaps the first land pattern and is equal to or greater in size than the first land pattern.

6. The electronic control unit according to claim 5, wherein the plurality of wiring patterns includes a fourth layer wiring pattern, the plurality of insulating layers includes a fourth insulating layer, the fourth layer wiring pattern is stacked on the third layer wiring pattern across the fourth insulating layer, the fourth layer wiring pattern has a second ground pattern connected to the ground terminal of the connector, and the second ground pattern overlaps the second land pattern and is equal to or greater in size than the second land pattern.

7. The electronic control unit according to claim 1, wherein the heat-generating device has a slag exposed on an opposite side from the board.

8. The electronic control unit according to claim 1, further comprising:

a heat-dissipating member, wherein the heat-dissipating member is in contact with the heatsink through the heat-dissipating member.

9. The electronic control unit according to claim 8, wherein the heat-dissipating member is made of an electrically insulating material, the heat-dissipating device has a terminal electrically connected to the board, and the terminal is exposed on the same side as the heatsink.

10. The electronic control unit according to claim 1, wherein the heatsink has a pillar portion located adjacent to the heat-dissipating device, and the pillar portion defines a room where the heat-dissipating device is placed.

11. The electronic control unit according to claim 10, wherein the pillar portion is in contact with the board.

12. An electric power steering apparatus for a vehicle comprising:

an electronic control unit as defined in claim 1, and a rotating electrical machine configured to produce assisting-torque to help a driver to steer the vehicle, wherein the heat-generating device of the electronic control unit is a driving device, and the rotating electrical machine is controlled by switching ON and OFF the driving device.

\* \* \* \* \*